US010199497B2

United States Patent
Cho et al.

(10) Patent No.: US 10,199,497 B2
(45) Date of Patent: Feb. 5, 2019

(54) SEMICONDUCTOR DEVICES INCLUDING VERTICAL CHANNEL TRANSISTORS

(71) Applicant: SAMSUNG ELECTRONICS CO., LTD., Suwon-si, Gyeonggi-do (KR)

(72) Inventors: Wooyeong Cho, Suwon-si (KR); Jaekyu Lee, Seongnam-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/672,767

(22) Filed: Aug. 9, 2017

(65) Prior Publication Data

US 2018/0069117 A1    Mar. 8, 2018

(30) Foreign Application Priority Data

Sep. 8, 2016  (KR) .................. 10-2016-0115817

(51) Int. Cl.
  H01L 27/108    (2006.01)
  H01L 29/76    (2006.01)
  H01L 29/94    (2006.01)
  H01L 31/119    (2006.01)
  H01L 29/78    (2006.01)

(52) U.S. Cl.
  CPC .... H01L 29/7827 (2013.01); H01L 27/10876 (2013.01); H01L 27/10885 (2013.01); H01L 27/10891 (2013.01)

(58) Field of Classification Search
  None
  See application file for complete search history.

(56) References Cited

U.S. PATENT DOCUMENTS

| 7,109,544 | B2 | 9/2006 | Schloesser et al. |
| 7,795,620 | B2 | 9/2010 | Huang |
| 8,537,631 | B2 | 9/2013 | Chung |
| 8,629,533 | B2 | 1/2014 | Thomas |
| 8,809,926 | B2 | 8/2014 | Kim et al. |
| 9,287,271 | B2 | 3/2016 | Wang et al. |
| 2001/0002718 | A1* | 6/2001 | Hofmann ............ G11C 11/5692 257/390 |

FOREIGN PATENT DOCUMENTS

| JP | 4369405 B2 | 11/2009 |
| KR | 10-0613526 B1 | 8/2006 |
| KR | 2012-0118785 A | 10/2012 |
| KR | 2013-0027155 A | 3/2013 |

* cited by examiner

Primary Examiner — Thien F Tran
(74) Attorney, Agent, or Firm — Lee & Morse P.C.

(57) ABSTRACT

A semiconductor device includes an active pillar that protrudes above a substrate, the active pillar including a pair of vertical sections and a body interconnection between the pair of vertical sections, and each of the pair of vertical sections having a channel body and a lower impurity region below the channel body, word lines coupled to respective channel bodies, and buried bit lines in contact with respective lower impurity regions, wherein the channel bodies are connected to the substrate through the body interconnection.

19 Claims, 39 Drawing Sheets

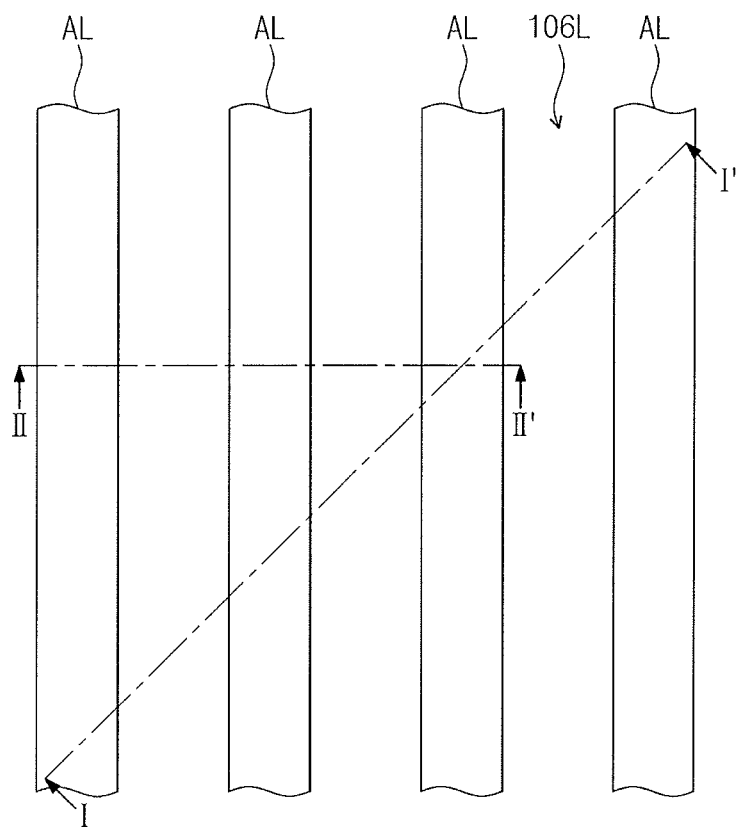
FIG. 15A
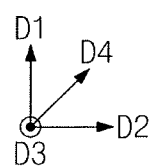

SEMICONDUCTOR DEVICES INCLUDING VERTICAL CHANNEL TRANSISTORS

CROSS-REFERENCE TO RELATED APPLICATION

Korean Patent Application No. 10-2016-0115817, filed on Sep. 8, 2016, in the Korean Intellectual Property Office, and entitled: "Semiconductor Devices Including Vertical Channel Transistors," is incorporated by reference herein in its entirety.

BACKGROUND

1. Field

The present disclosure relates to a semiconductor device, and more particularly, to a semiconductor device including a vertical channel transistor.

2. Description of the Related Art

A semiconductor device has an important role in the electronic industry because of its small size, multi-function, and/or low fabrication cost. The semiconductor device is being highly integrated in the electronic industry, so line widths of patterns of the semiconductor device are being reduced for the high integration. However, new exposure techniques and/or expensive exposure techniques are required for the reduced line widths of such patterns, thereby making high integration difficult.

SUMMARY

According to exemplary embodiments, a semiconductor device may include an active pillar that protrudes above a substrate, wherein the active pillar may include a pair of vertical sections and a body interconnection between the pair of vertical sections, each of the pair of vertical sections including a channel body and a lower impurity region below the channel body; word lines each of which is coupled to each of the channel bodies; and buried bit lines each of which is in contact with each of the lower impurity regions. The channel bodies may be connected to the substrate through the body interconnection.

According to other exemplary embodiments, a semiconductor device may include a first vertical channel transistor and a second vertical channel transistor on a substrate; and a body interconnection that is commonly connected to a first channel body of the first vertical channel transistor and a second channel body of the second vertical channel transistor. The body interconnection may be electrically connected to the substrate to provide the first and second channel bodies with an external voltage that is applied to the substrate.

According to yet other exemplary embodiments, a semiconductor device may include an active pillar that protrudes above a substrate, the active pillar having vertical channel bodies respectively provided at two distal opposite ends of the active pillar, a body interconnection between the two distal opposite ends of the active pillar, the body interconnection electrically connecting the vertical channel bodies to the substrate, and lower impurity regions respectively provided at the two distal opposite ends of the active pillar, each of the lower impurity regions being between each of the vertical channel bodies and the substrate, word lines covering respective sidewalls of the two distal opposite ends of the active pillar and being adjacent to respective vertical channel bodies, and buried bit lines respectively provided at the two distal opposite ends of the active pillar and being in contact with respective lower impurity regions.

BRIEF DESCRIPTION OF THE DRAWINGS

Features will become apparent to those of ordinary skill in the art by describing in detail exemplary embodiments with reference to the attached drawings, in which:

FIGS. 4A to 12A illustrate plan views of stages in a method of fabricating a semiconductor device including the vertical channel transistors of FIG. 2.

FIGS. 4B to 12B illustrate cross-sectional views taken along line I-I' of FIGS. 4A to 12A, respectively.

FIGS. 4C to 12C illustrate cross-sectional views taken along line II-II' of FIGS. 4A to 12A, respectively.

FIGS. 15A to 20A illustrate plan views of stages in a method of fabricating a semiconductor device including the vertical channel transistors of FIG. 13.

FIGS. 15B to 20B illustrate cross-sectional views taken along line I-I' of FIGS. 15A to 20A, respectively.

FIGS. 15C to 20C illustrate cross sectional views taken along line II-II' of FIGS. 15A to 20A, respectively.

DETAILED DESCRIPTION

Figure 1:
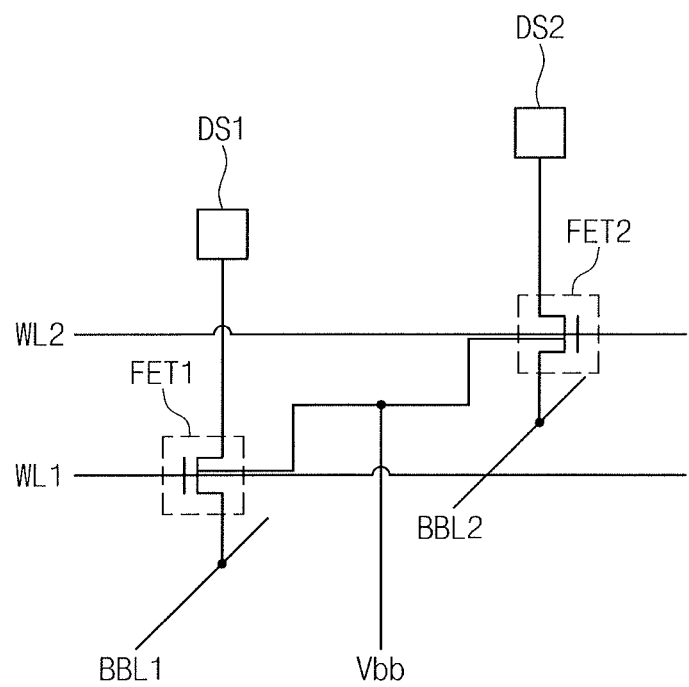
FIG. 1 illustrates a schematic circuit diagram of vertical channel transistors included in a semiconductor device according to exemplary embodiments.

FIG. 1 is a circuit diagram for schematically explaining vertical channel transistors included in a semiconductor device according to exemplary embodiments.

Referring to FIG. 1, a plurality of transistors FET1 and FET2 may be included in a semiconductor device according to exemplary embodiments. The transistors FET1 and FET2 may include a first vertical channel transistor FET1 and a second vertical channel transistor FET2. The first and second vertical channel transistors FET1 and FET2 may have own gates each of which is electrically connected to a corresponding one of word lines WL1 and WL2. For example, the first vertical channel transistor FET1 may be electrically connected to a first word line WL1, and the second vertical channel transistor FET2 may be electrically connected to a second word line WL2.

The first vertical channel transistor FET1 may include a first source/drain that is electrically connected to a first buried bit line BBL1, and the second vertical channel transistor FET2 may include a first source/drain that is electrically connected to a second buried bit line BBL2. The first and second buried bit lines BBL1 and BBL2 may be controlled independently of each other. The word lines WL1 and WL2 may cross the buried bit lines BBL1 and BBL2.

A first data storage element DS1 may be provided electrically connected to a second source/drain of the first vertical channel transistor FET1, and a second data storage element DS2 may be provided electrically connected to a second source/drain of the second vertical channel transistor FET2. In an embodiment, the first vertical channel transistor FET1 and the first data storage element DS1 may be included in a unit memory cell. Likewise, the second vertical channel transistor FET2 and the second data storage element DS2 may be included in a unit memory cell. Each of the first and second vertical channel transistors FET1 and FET2 may be used as a switching element of its corresponding unit memory cell. The data storage elements DS1 and DS2 may be accomplished in various types. For example, the first and second data storage elements DS1 and DS2 may be embodied as capacitors, magnetic tunnel junction patterns, variable resistance structure, or the like. As such, semiconductor devices according to exemplary embodiments may be utilized as, e.g., a volatile memory device, a nonvolatile memory device, a magnetic memory device, a resistive memory device, or the like. However, the first and second data storage elements DS1 and DS2 may not be limited thereto, and may be embodied as other types.

According to the present disclosure, the first and second vertical channel transistors FET1 and FET2 may include own bodies that are connected to each other thorough a body interconnection. The body interconnection may also be directly or indirectly connected to a substrate. Accordingly, the bodies of the first and second vertical channel transistors FET1 and FET2 may be electrically connected to an external terminal that provides an external voltage Vbb to the substrate. In conclusion, as the external voltage Vbb is applied to the substrate and also to the bodies of the first and second vertical channel transistors FET1 and FET2 through the body interconnection, the vertical channel transistors FET1 and FET2 may be suppressed from suffering floating body phenomenon.

Hereinafter, a detailed explanation of a vertical channel transistor and a semiconductor device including the same according to exemplary embodiments of the present disclosure is provided.

Figure 2:
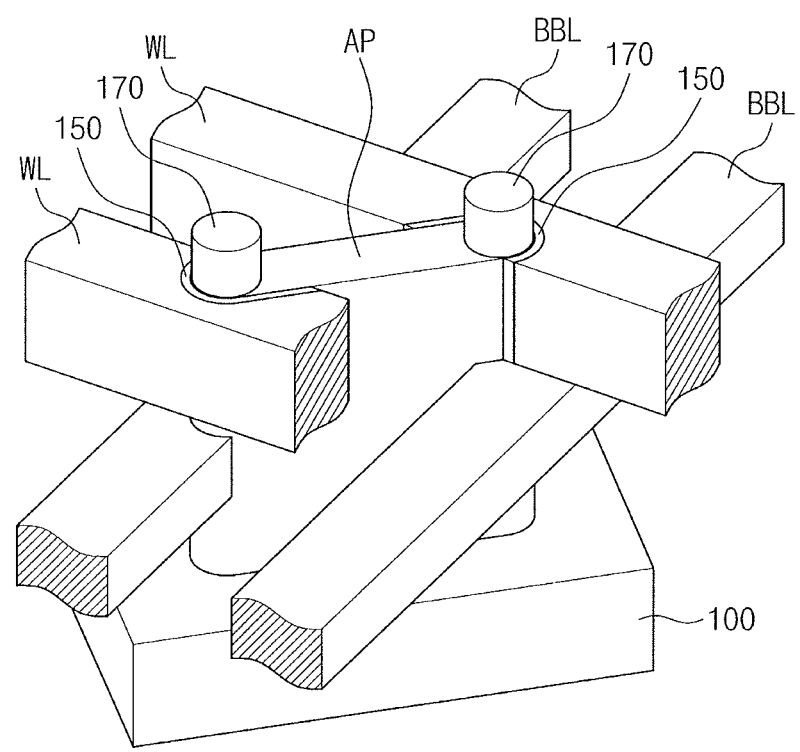
FIG. 2 illustrates a simplified perspective view of vertical channel transistors according to exemplary embodiments.
Figure 2:
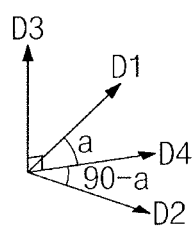
Figure 3A:
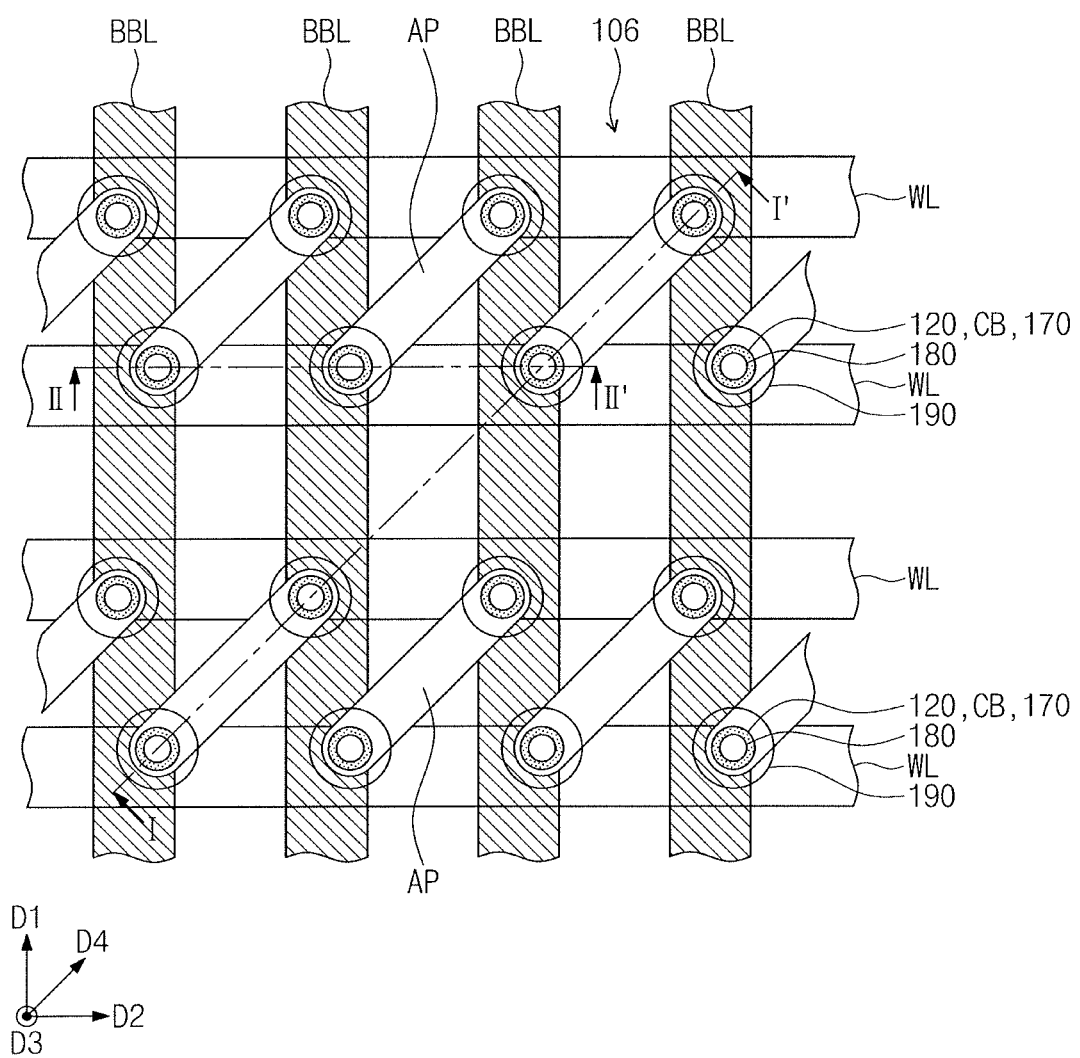
FIG. 3A illustrates a plan view of a semiconductor device including the vertical channel transistors of FIG. 2.
Figure 3B:
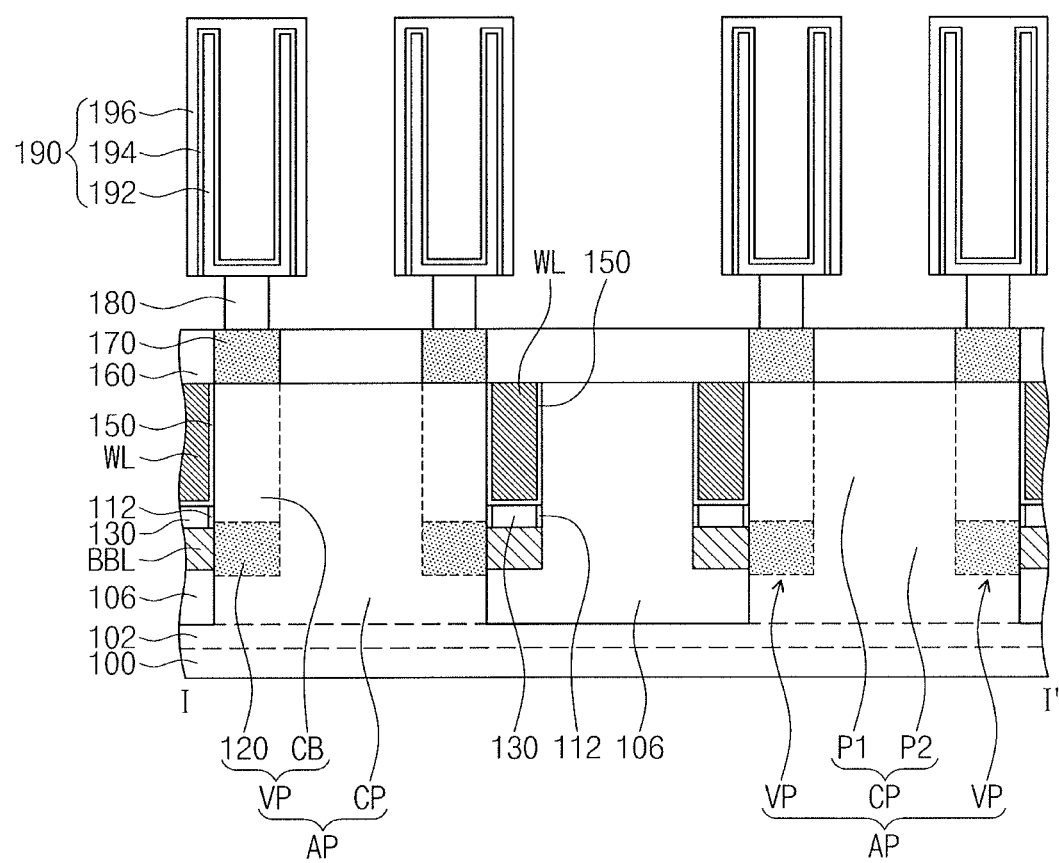
FIGS. 3B and 3C illustrate cross-sectional views respectively taken along lines I-I' and II-II' of FIG. 3A.
Figure 3C:
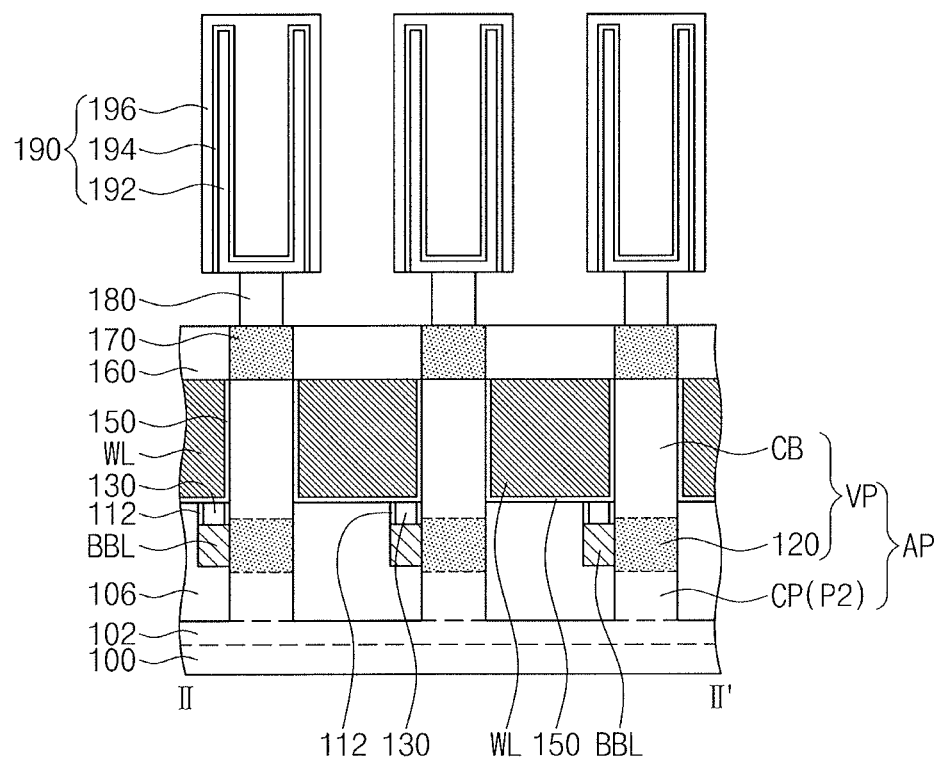

FIG. 2 is a simplified perspective view illustrating vertical channel transistors according to exemplary embodiments. FIG. 3A is a plan view of a semiconductor device including the vertical channel transistors of FIG. 2. FIGS. 3B and 3C are cross-sectional views respectively taken along lines I-I' and II-II' of FIG. 3A.

Referring to FIGS. 2 and 3A to 3C, a substrate 100 may be provided with an active pillar AP thereon. The active pillar AP may have an island shape extending in a fourth direction D4 and protruding in a third direction D3, e.g., upward from the substrate 100. The fourth direction D4 may be inclined at some angle relative to each of first and second directions D1 and D2 on the same plane. For example, the fourth direction D4 may be inclined at "a" angle relative to the first direction D1 and at about (90−a) angle relative to the second direction D2. In this description, the first direction D1 may correspond to an extending direction of a buried bit line BBL, which will be discussed below, and the second direction D2 may correspond to an extending direction of a word line WL, which will be discussed below. The first and second directions D1 and D2 may be relatively perpendicular to each other. The "a" angle may be in the range between 0° and 90°, e.g., 45°. The third direction D3 may be perpendicular to a top surface of the substrate 100. Hence, the third direction D3 may be perpendicular to all of the first, second, and fourth directions D1, D2, and D4. Therefore, the buried bit line BBL and the word line WL may be perpendicular to each other, and the active pillar AP may be diagonally inclined relative to the buried bit line BBL and the word line WL.

The substrate 100 may include a semiconductor material, e.g., a silicon substrate. The substrate 100 may include therein a well region 102 of a first conductivity (e.g., p-type conductivity). The active pillar AP may include silicon like the substrate 100. The active pillar AP may have curved sidewalls at its opposite distal ends, but the present disclosure is not limited thereto.

The active pillar AP may include a pair of vertical sections VP and a body interconnection CP therebetween. Each of the vertical sections VP may include a channel body CB and a lower impurity region 120 below the channel body CB. The channel body CB and the body interconnection CP may be doped with the same type impurity. For example, the channel body CB and the body interconnection CP may be doped with first conductive impurities (e.g., p-type impurities), i.e., the same as that of the well region 102. The lower impurity region 120 may be doped with impurities different from those of the channel body CB and the body interconnection CP. For example, the lower impurity region 120 may be doped with second conductive impurities (e.g., n-type impurities) different from the first conductive impurities. Each of the pair of vertical sections VP may be provided at each of the distal ends of the active pillar AP, and the body interconnection CP may be defined to indicate a remaining portion other than the vertical sections VP of the active pillar AP.

In detail, the body interconnection CP may include a first part P1 that is commonly connected to a pair of channel bodies CB and a second part P2 that extends downward from the first part P1 while being in contact with the lower impurity region 120. In an embodiment, the second part P2 of the body interconnection CP may be directly connected to the substrate 100. In other words, the body interconnection CP may be in contact with the well region 102 of the substrate 100. In this configuration, the pair of channel bodies CB of the active pillar AP may be commonly connected to the body interconnection CP and also electrically connected to the well region 102 of the substrate 100 through the body interconnection CP. In an embodiment, the second part P2 of the body interconnection CP may extend between the substrate 100 and the lower impurity region 120. In this case, the lower impurity region 120 may be spaced apart from the substrate 100. The present disclosure is, however, not limited thereto.

Upper impurity regions 170 may be disposed on top surfaces of the channel bodies CB. Each of the upper impurity regions 170 may be in direct contact with the channel body CB therebelow. The upper impurity regions 170 may include, e.g., a silicon layer doped with the second conductive impurities.

The word lines WL may be coupled to the distal ends of the active pillar AP. In detail, one of the word lines WL may be disposed on a sidewall of one of the channel bodies CB. Each of the word lines WL may envelop the sidewall of the channel body CB and extend in the second direction D2. As viewed in a plan view (FIG. 3) and in a perspective view (FIG. 2), the word lines WL may not overlap the active pillar AP, e.g., the word lines WL may extend only along sidewalls of the distal ends of the active pillar AP without overlapping top or bottom surfaces of the active pillar AP. In an embodiment, the word lines WL may have top surfaces lying at substantially the same height as that of the active pillar AP (FIG. 2). The present disclosure is, however, not limited thereto. The word lines WL may include at least one of doped semiconductor (e.g., doped silicon), metal (e.g., tungsten, titanium, or tantalum), conductive metal nitride (e.g., titanium nitride or tantalum nitride), or conductive metal-semiconductor compound (e.g., metal silicide).

A gate dielectric pattern 150 may be interposed between each of the word lines WL and each of the channel bodies CB, e.g., between each of the word lines WL and a corresponding channel body CB. The gate dielectric pattern 150 may include a silicon oxide layer or a high-k dielectric layer with a dielectric constant greater than that of silicon oxide.

The buried bit lines BBL may be coupled to the distal ends of the active pillar AP. In detail, one of the buried bit lines BBL may be disposed on a sidewall of one of the lower impurity regions 120. In other words, the buried hit lines BBL may be positioned lower than the word lines WL (FIG. 2). Each of the buried bit lines BBL may envelop the sidewall of the lower impurity region 120 and extend in the first direction D1. As viewed in a plan view, the buried bit lines BBL may not overlap the active pillar AP and may be disposed to cross (e.g., perpendicularly cross) the word lines WL, e.g., the buried bit lines BBL may only partially extend along sidewalls of the distal ends of the active pillar AP without overlapping top or bottom surfaces of the active pillar AP. The buried bit line BBL and the lower impurity region 120 may have their own sidewalls that facingly contact with each other. In an embodiment, the buried bit lines BBL may include at least one of metal (e.g., tungsten, titanium, or tantalum), conductive metal nitride (e.g., titanium nitride or tantalum nitride), or conductive metal-semiconductor compound (e.g., metal silicide). According to the present disclosure, the buried bit lines BBL may exhibit lower resistance due to its metallic constituent material, compared with a case the buried bit lines BBL include polysilicon.

The pair of channel bodies CB correspond to bodies of the first and second vertical channel transistors FET1 and FET2 discussed with reference to FIG. 1, and the pair of lower impurity regions 120 correspond to the first source/drains of the first and second vertical channel transistors FET1 and FET2. A pair of upper impurity regions 170 correspond to the second source/drains of the first and second vertical channel transistors FET1 and FET2 discussed with reference to FIG. 1. The pair of word lines WL coupled to the channel bodies CB across the gate dielectric pattern 150 include portions corresponding to the gates of the first and second vertical channel transistors FET1 and FET2 discussed with reference to FIG. 1. Hence, one active pillar AP and a pair of word lines WL coupled thereto constitute a pair of vertical channel transistors.

A plurality of active pillars AP may be included in the semiconductor device according to exemplary embodiments of the present disclosure. The plurality of active pillars AP may be arranged along the first and second directions D1 and D2 to constitute a plurality of rows and columns. A plurality of word lines WL may be arranged spaced apart from each other along the first direction D1, and a single word line WL may be coupled to a plurality of active pillars AP arranged along the second direction D2. For example, a plurality of channel bodies CB coupled to a single word line WL may be linearly arranged along the second direction D2. Likewise, a plurality of buried bit lines BBL may be arranged spaced apart from each other along the second direction D2, and a single buried bit line BBL may be coupled to a plurality of active pillars AP arranged along the first direction D1. For example, a plurality of lower impurity regions 120 commonly coupled to a single buried bit line BBL may be arranged in a zigzag fashion along the first direction D1.

A device isolation layer 106 may be disposed between the active pillars AP. The active pillars AP may thus be separated from each other by the device isolation layer 106. The device isolation layer 106 may include, e.g., silicon oxide. The buried bit lines BBL may be buried in the device isolation layer 106.

Buried dielectric patterns 130 may be disposed between the word lines WL and the buried bit lines BBL. The buried dielectric patterns 130 may have island shapes disposed at overlapping positions of the word lines WL and the buried bit lines BBL. The buried dielectric patterns 130 may include, e.g., silicon oxide. Liner patterns 112 may be disposed on sidewalls of the buried dielectric patterns 130. The liner patterns 112 may be in contact with the device isolation layer 106 or the active pillar AP. The liner patterns 112 may extend in the first direction D1 along top surfaces of the buried bit lines BBL. At the overlapping positions of the word lines WL and the buried bit lines BBL, the liner patterns 112 may have top surfaces lower than bottom surfaces of the word lines WL. The gate dielectric pattern 150 may extend between each of the word lines WL and each of the buried dielectric patterns 130 and between each of the word lines WL and the device isolation layer 106.

A mold dielectric layer 160 may be disposed on the device isolation layer 106. The mold dielectric layer 160 may cover. e.g., at least partially, the top surfaces of word lines WL and the top surfaces of the active pillars AP, and may surround sidewalls of the upper impurity regions 170. The mold dielectric layer 160 may include at least one of, e.g., a silicon oxide layer or a silicon nitride layer.

Data storage elements 190 may be electrically connected to the upper impurity regions 170 through contact plugs 180. In an embodiment, the data storage elements 190 may be capacitors. For example, each of the data storage elements 190 may include a bottom electrode 192, a dielectric layer 194, and a top electrode 196. In this case, the semiconductor device according to exemplary embodiments may by a DRAM (Dynamic RMA) device. In other embodiments, the data storage elements 190 may be embodied as magnetic tunnel junction (MTJ) patterns or variable resistance structures. Each of the data storage elements 190 may constitute a unit memory cell.

In some embodiments, a single active pillar AP may be embodied as two unit memory cells. For example, a single active pillar AP may be shared by a pair of unit memory cells that are diagonally adjacent to each other, e.g., along the fourth direction D4. A single active pillar AP may include the vertical sections VP constituting a pair of vertical channel transistors and the body interconnection CP between the vertical sections VP. The body interconnection CP may be coupled to the well region 102 of the substrate 100 while being commonly connected to the channel bodies CB of the vertical sections VP. In this configuration, an external voltage (see Vbb of FIG. 1) may be supplied to the well region 102 of the substrate 100 and also to the channel bodies CB through the body interconnection CP, and hence the channel bodies CB may be prevented from floating. In conclusion, the semiconductor device according to exemplary embodiments may be free of floating body effect that increases threshold instability of transistors and deteriorates dynamic reference characteristics of semiconductor memory devices.

A method of fabricating a semiconductor device including the vertical channel transistors of FIG. 2 will be described hereinafter with reference to FIGS. 4A-12C. FIGS. 4A to 12A are plan views of stages in a method of fabricating a semiconductor device including the vertical channel transistors of FIG. 2. FIGS. 4B to 12B are cross-sectional views taken along line I-I' of FIGS. 4A to 12A, respectively. FIGS. 4C to 12C are cross-sectional views taken along line II-II' of FIGS. 4A to 12A, respectively.

Figure 4A:
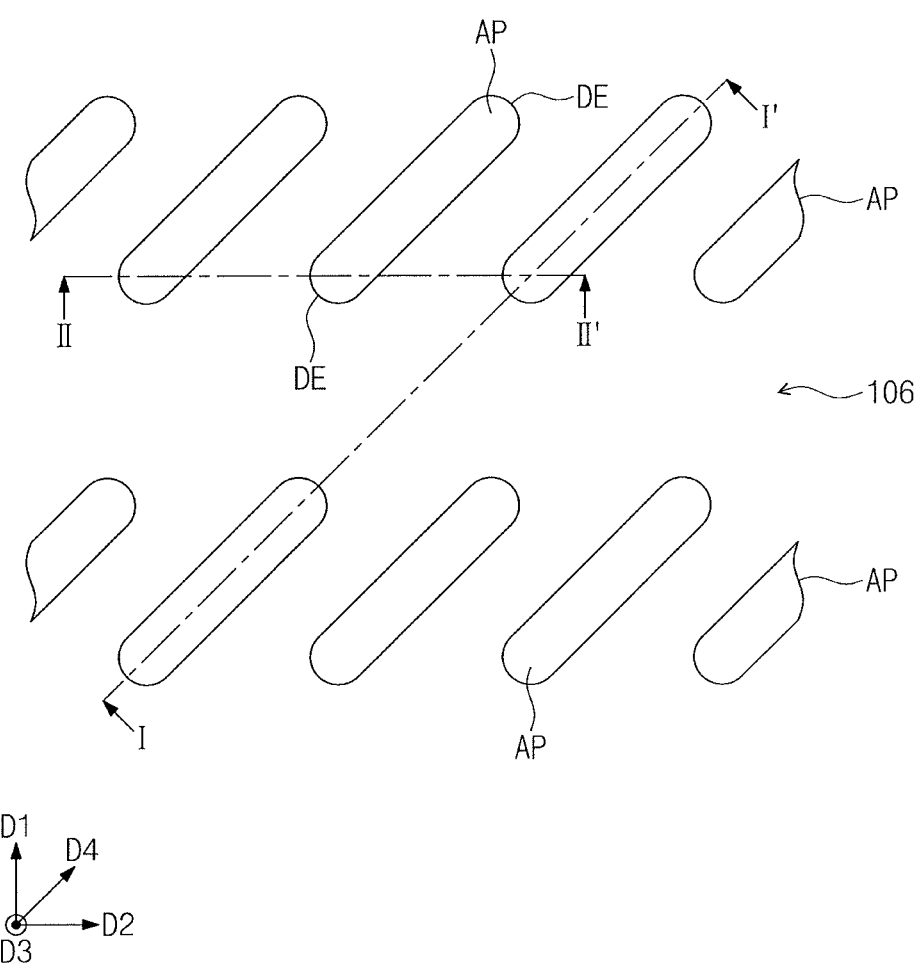
Figure 4B:
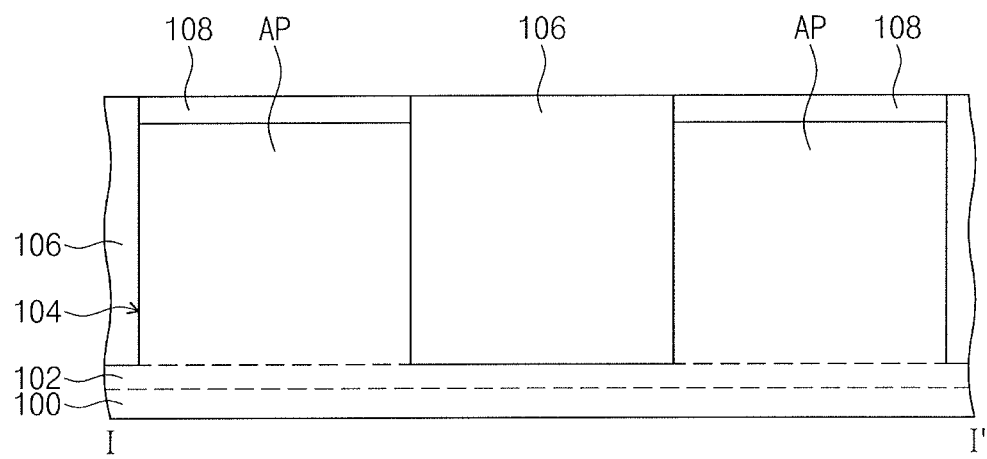
Figure 4C:
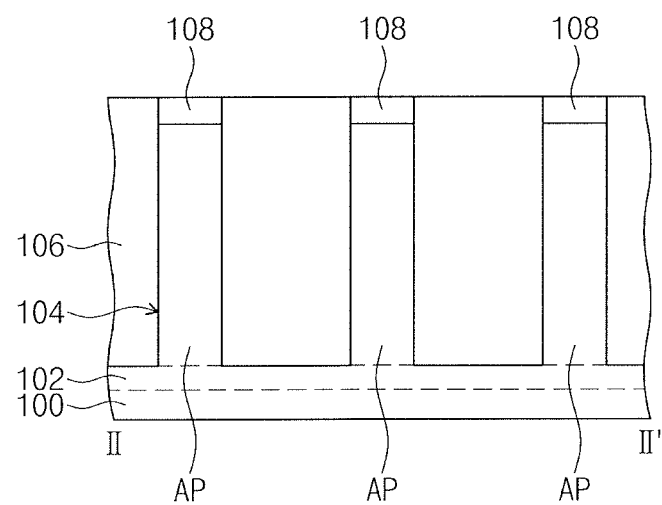

Referring to FIGS. 4A, 4B, and 4C, a plurality of active pillars AP may be formed on the substrate 100. The active pillars AP may be arranged along the first direction D1 and the second direction D2 crossing the first direction D1, and may protrude in the third direction D3 perpendicular to all of the first and second directions D1 and D2. As viewed in a plan view (FIG. 4A), e.g., each of, the active pillars AP may have an island shape elongated in the fourth direction D4 diagonal to all of the first and second directions D1 and D2. The active pillar AP may have a curved shape at its opposite distal ends DE, e.g., opposite ends spaced apart from each other along the fourth direction D4, but the present disclosure is not limited thereto.

The active pillars AP may be defined by forming a first trench 104 in the substrate 100 and forming a device isolation layer 106 in the first trench 104. The first trench 104 may be formed by forming on the substrate 100 hardmask patterns 108 defining planar positions of the active pillars AP, and etching the substrate 100 using the hardmask patterns 108 as an etching mask. The substrate 100 may include a semiconductor material, e.g., a silicon substrate. The substrate 100 may include therein a well region 102 doped with first conductive impurities, e.g., p-type impurities. The active pillars AP may be in contact with the well region 102. The device isolation layer 106 may include, e.g., a silicon oxide layer, and the hardmask patterns 108 may include, e.g., a silicon nitride layer.

Figure 5A:
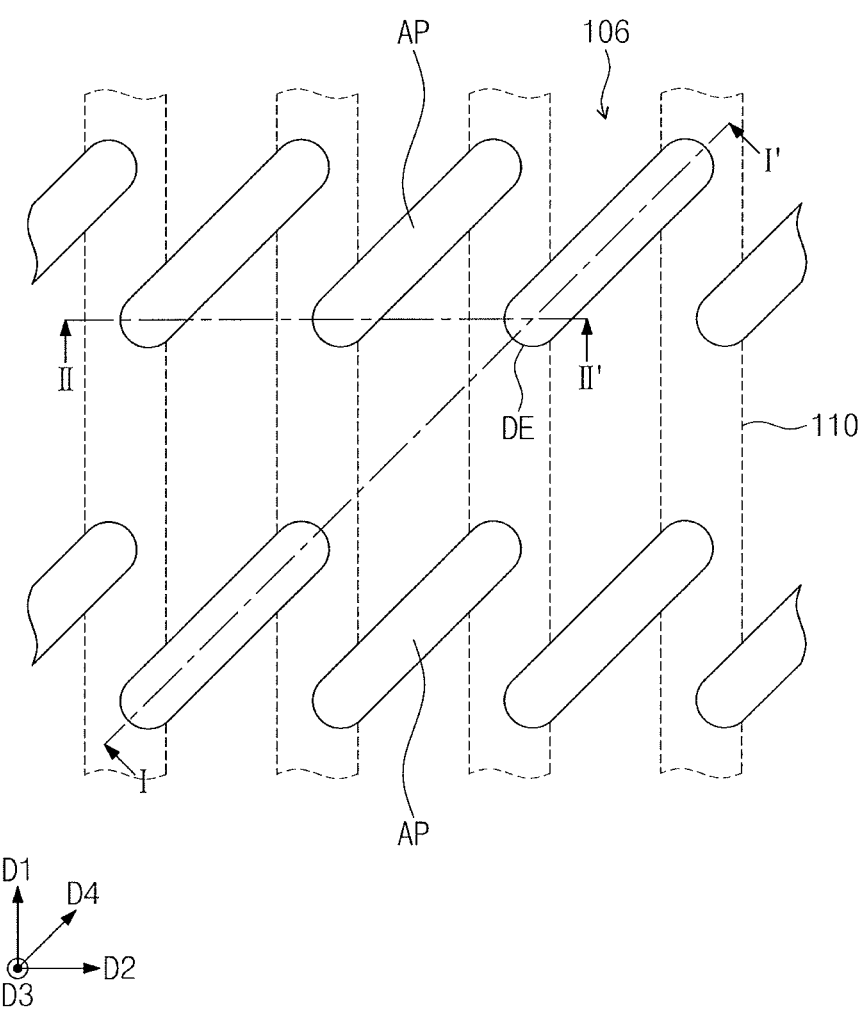
Figure 5B:
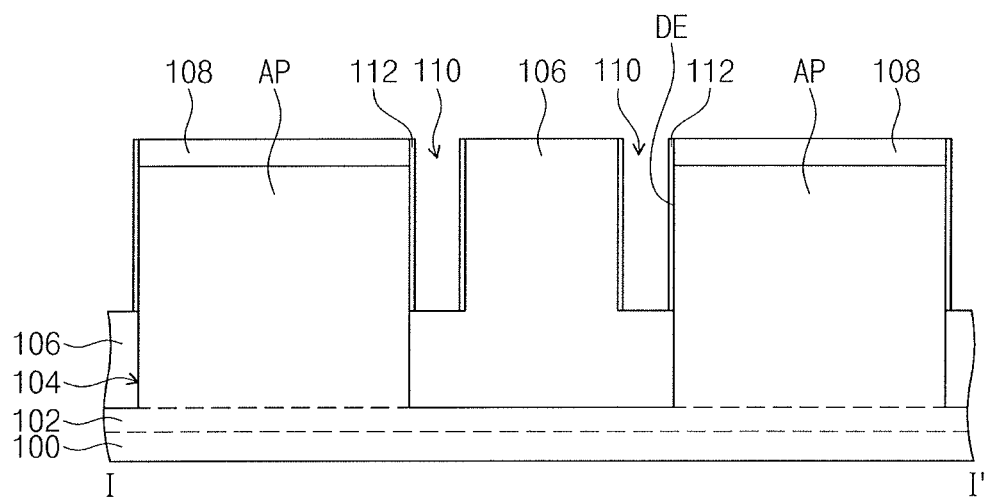
Figure 5C:
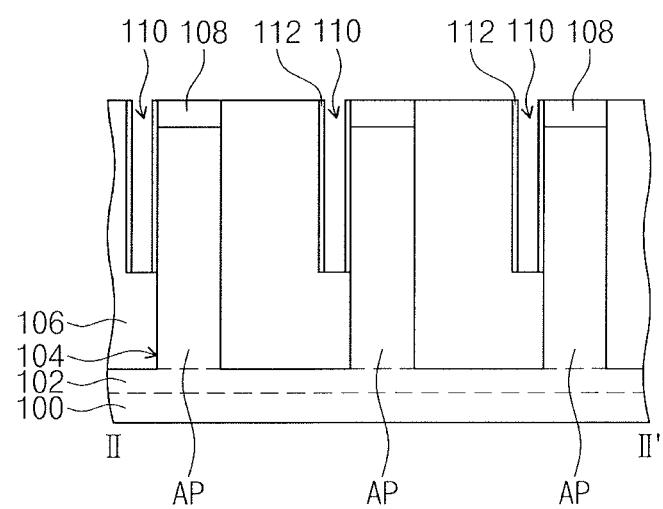

Referring to FIGS. 5A, 5B, and 5C, the device isolation layer 106 may be partially removed to form second trenches 110. The second trenches 110 may be formed to have line shapes side by side extending in the first direction D1 and to have depths less than that of the first trench 104. The second trenches 110 may be elongated in the first direction D1 and expose sidewalls of the distal ends DE of the active pillars AP. For example, as illustrated in FIG. 5A, a single second trench 110 may commonly expose sidewalls of a pair of the active pillars AP that are adjacent to each other in the second direction D2. When the second trenches 110 are formed, the distal ends of the active pillars AP may not be removed.

Liner patterns 112 may be disposed on sidewalls of the second trenches 110. The liner patterns 112 may extend in the first direction D1 along the second trenches 110 and cover the sidewalls of the active pillars AP exposed through the second trenches 110. The liner patterns 112 may be formed by forming on the substrate 100 a liner layer covering inner surfaces of the second trenches 110 and performing a blanket anisotropic etching process. The liner layer may include, e.g., a silicon nitride layer. The liner patterns 112 may protect the sidewalls of the active pillars AP exposed through the second trenches 110 in a subsequent process.

Figure 6A:
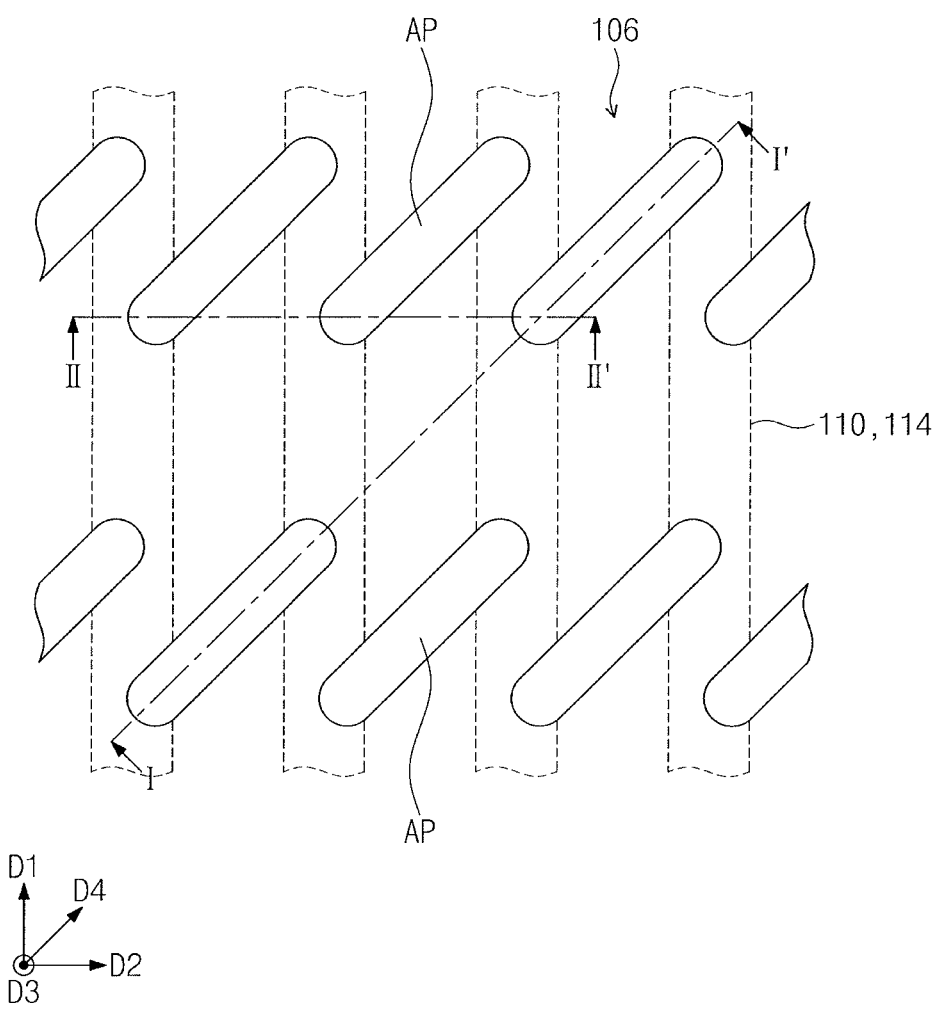
Figure 6B:
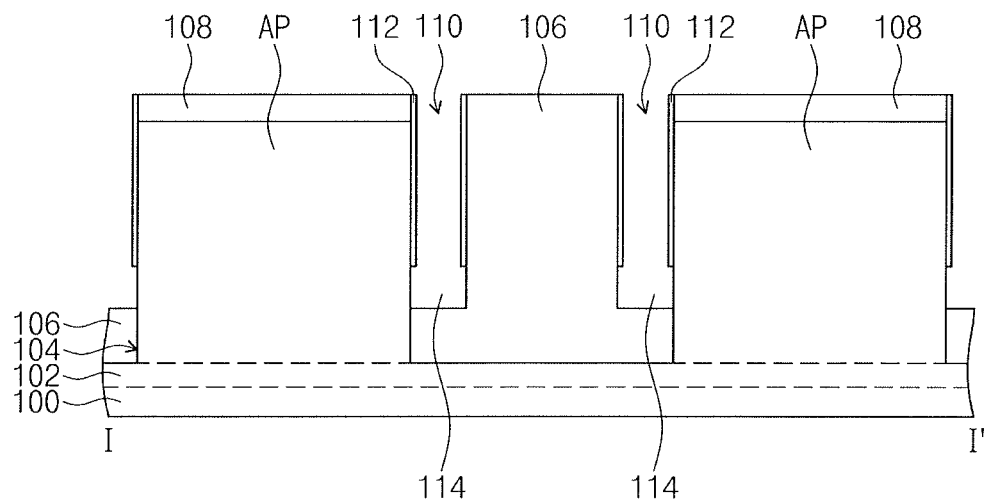
Figure 6C:
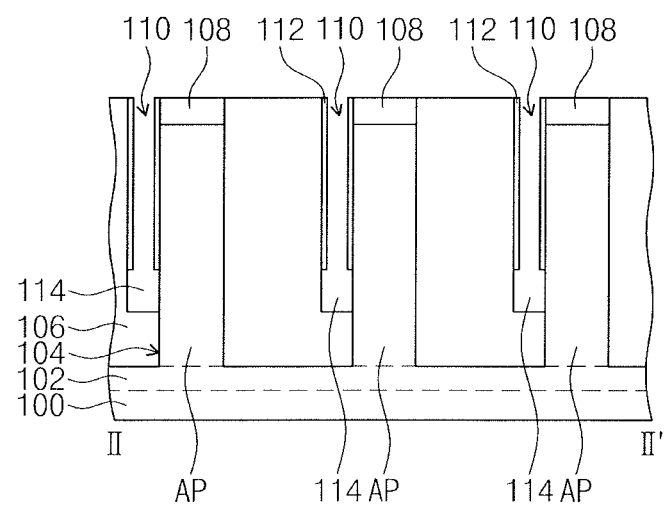

Referring to FIGS. 6A, 6B, and 6C, the device isolation layer 106 may be partially removed from below the second trenches 110 such that recess regions 114 may be formed. The recess regions 114 may extend in the first direction D1 along the second trenches 110 and expose sidewalls of the active pillars AP below the liner patterns 112.

Figure 7A:
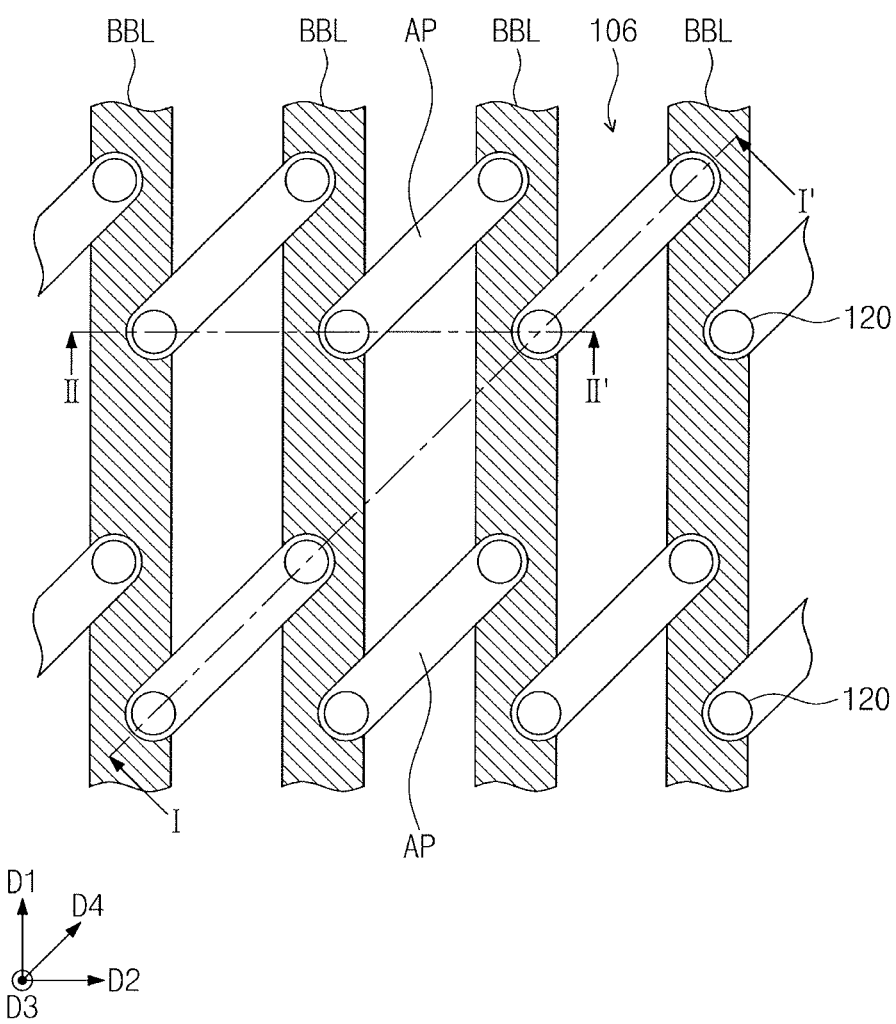
Figure 7B:
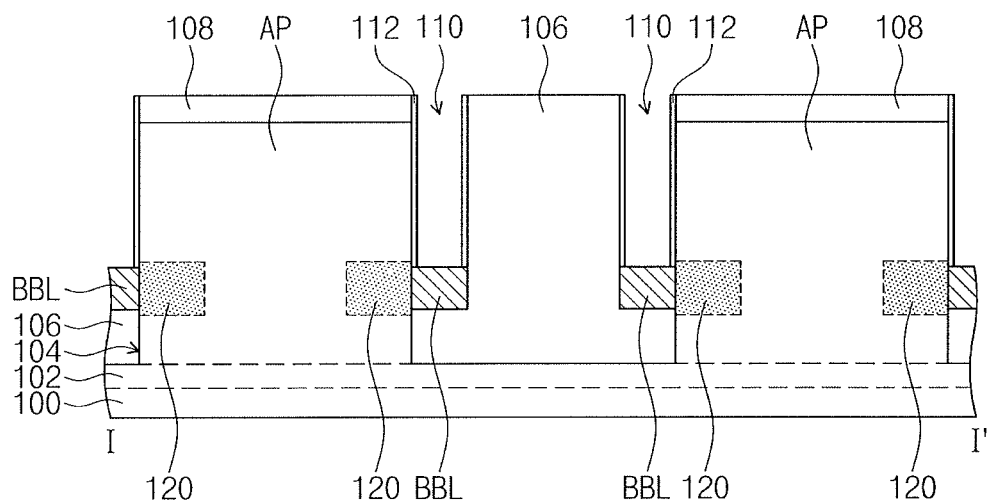
Figure 7C:
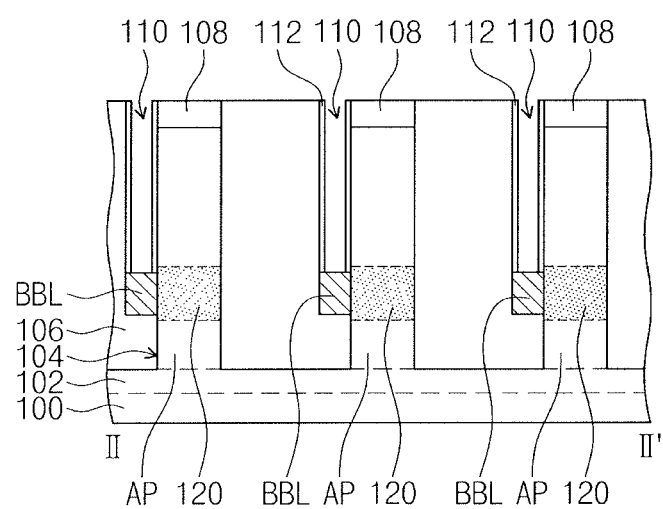

Referring to FIGS. 7A, 7B, and 7C, lower impurity regions 120 may be formed by an impurity injection into the sidewalls of the active pillars AP exposed through the recess regions 114. For example, the lower impurity regions 120 may be formed using an ion implantation process and a diffusion process. Thereafter, the recess regions 114 may be filled with a conductive material to form buried bit lines BBL. The conductive material may include at least one of metal (e.g., tungsten, titanium, or tantalum), conductive metal nitride (e.g., titanium nitride or tantalum nitride), or conductive metal-semiconductor compound (e.g., metal silicide). According to the present disclosure, the buried bit lines BBL may have a lower resistance due to its metallic constituent material, compared with a case the buried bit lines BBL include polysilicon.

Figure 8A:
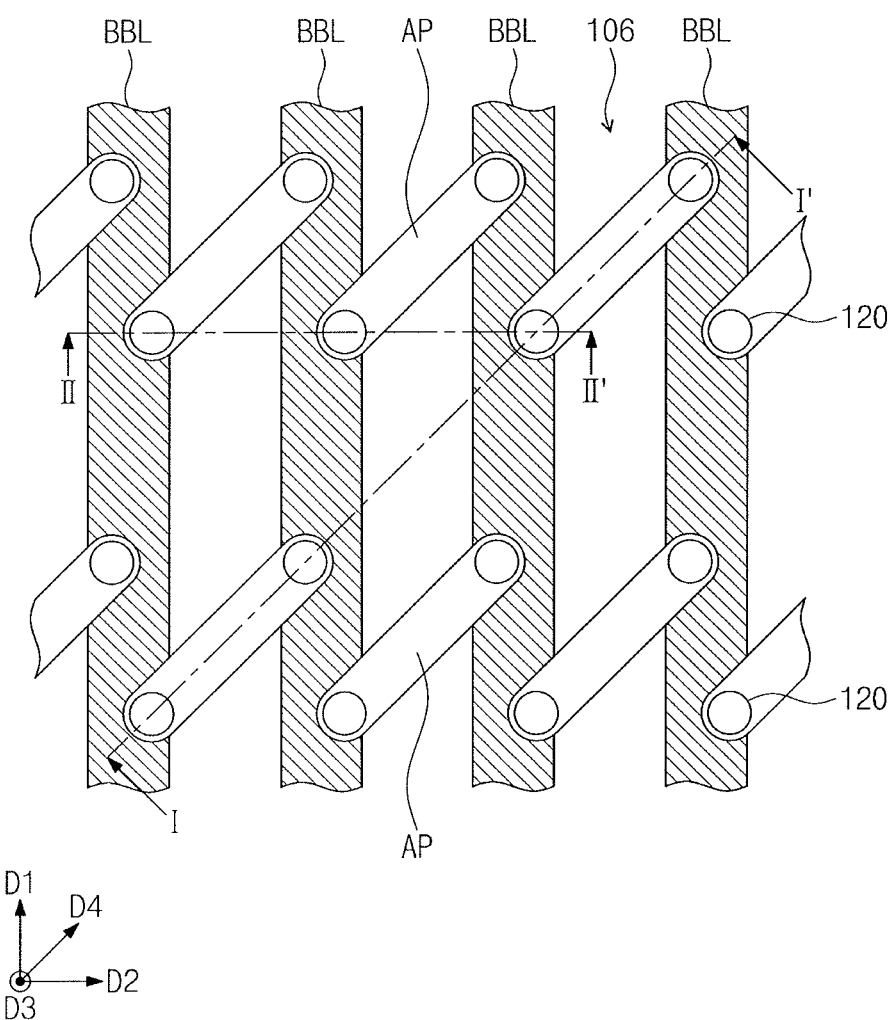
Figure 8B:
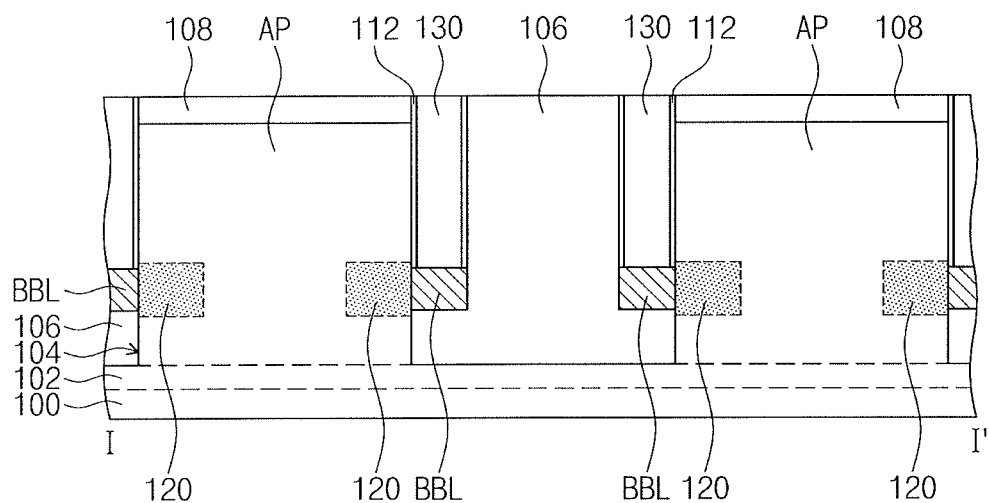
Figure 8C:
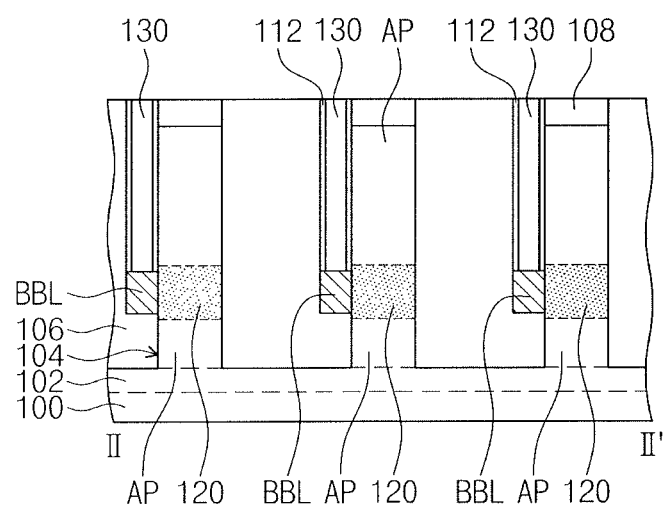

Referring to FIGS. 8A, 8B, and 8C, buried dielectric patterns 130 may be formed in the second trenches 110. The buried dielectric patterns 130 may be formed by forming on the substrate 100 a buried dielectric layer to fill the second trenches 110, i.e., above the buried bit lines BBL, and performing a planarization process. The buried dielectric layer may include, e.g., a silicon oxide layer.

Figure 9A:
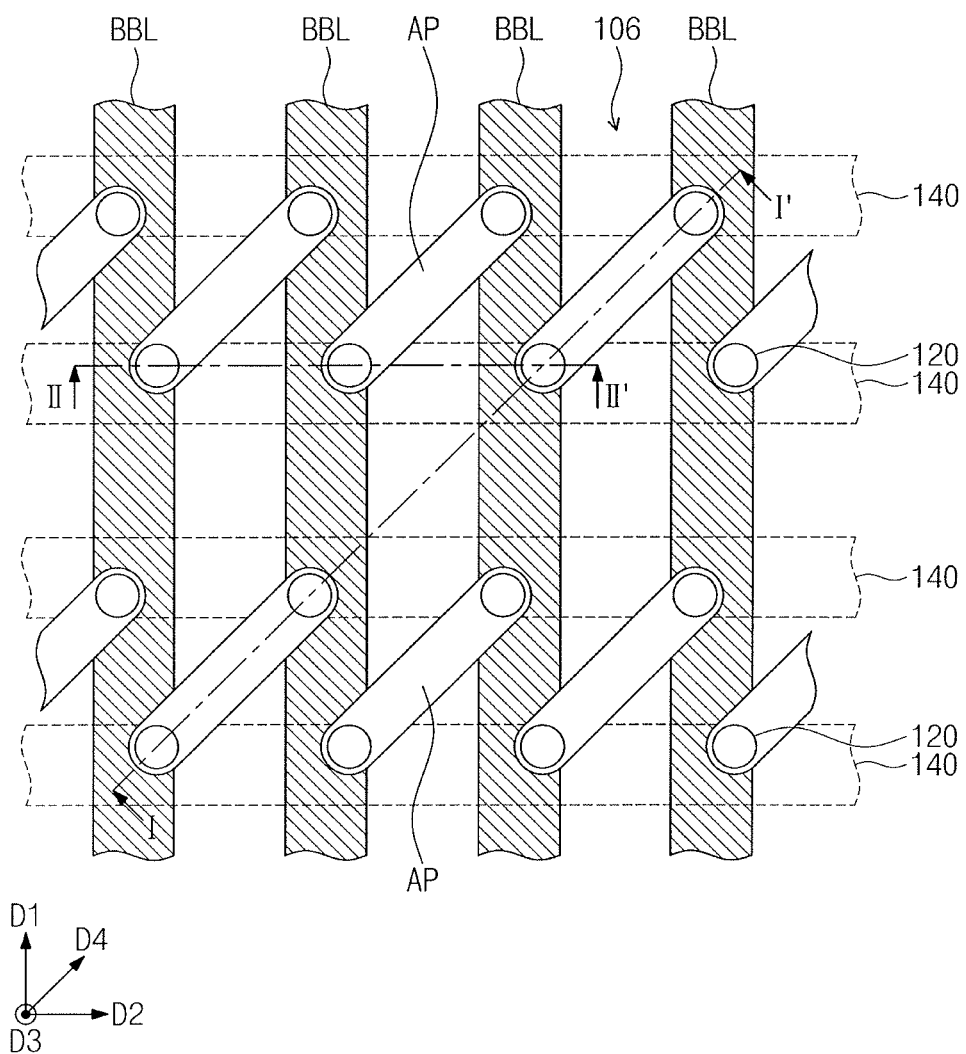
Figure 9B:
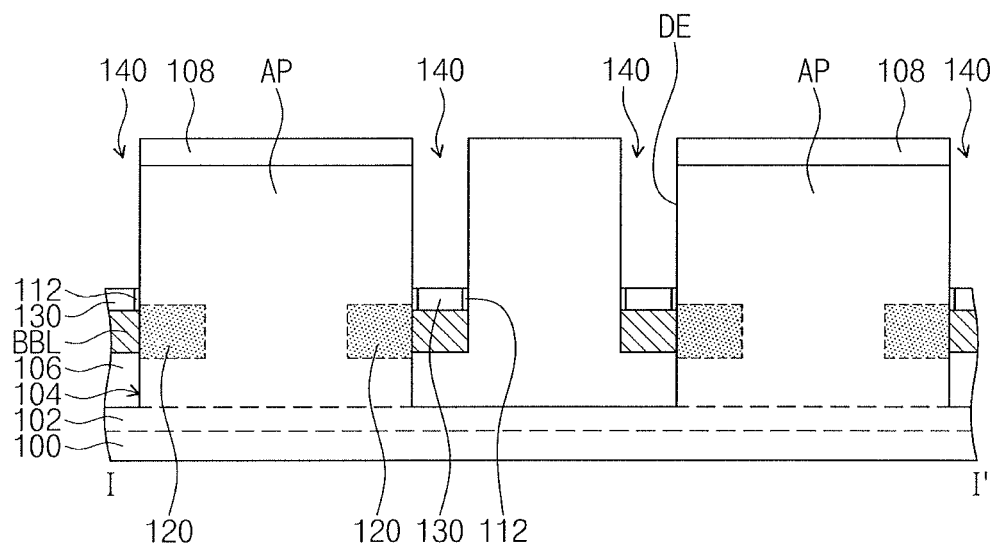
Figure 9C:
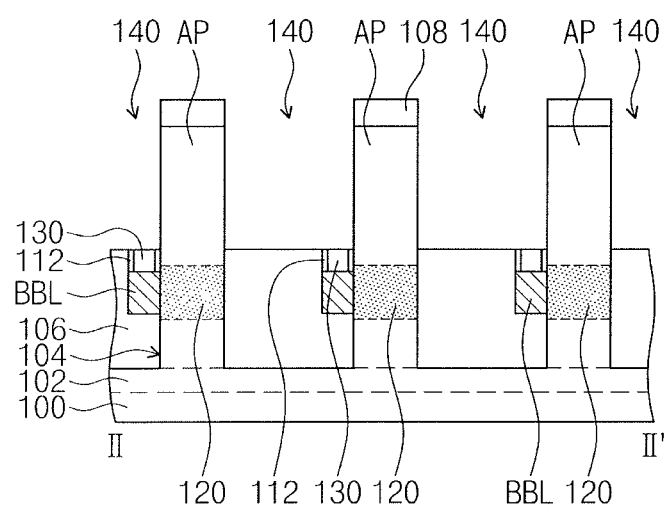

Referring to FIGS. 9A, 9B, and 9C, third trenches 140 may be formed by partially removing the device isolation layer 106, the buried dielectric patterns 130, and the liner patterns 112. The third trenches 140 may be formed to have line shapes side by side extending in the second direction D2 and exposing the sidewalls of the distal ends DE of the active pillars AP. The third trenches 140 may be formed to have depths less than those of the second trenches 110 of FIGS. 7 to 7C. The third trenches 140 may have bottom surfaces spaced apart from top surfaces of the buried bit lines BBL. For example, the third trenches 140 may be formed by forming a mask pattern on the substrate 100 and performing an etching process using the mask pattern to etch the device isolation layer 106, the buried dielectric patterns 130, and the liner patterns 112 that are exposed through the mask pattern. The mask pattern may not expose top surfaces of the active pillars AP. When the third trenches 140 are formed, the distal ends of the active pillars AP may not be removed. As illustrated in FIG. 9B, only upper portions of the buried dielectric patterns 130 are removed, so remaining portions of the buried dielectric patterns 130 separate between the buried bit lines BBL and corresponding third trenches 140.

Figure 10A:
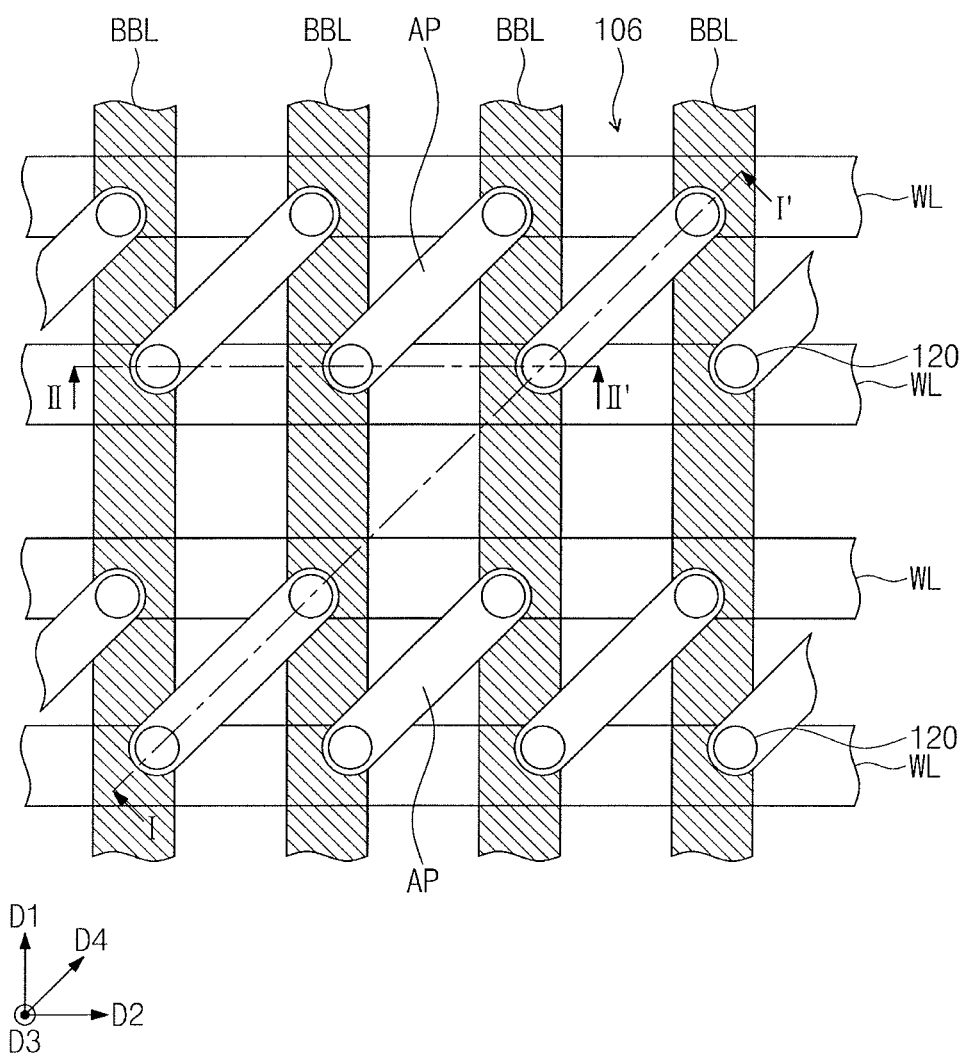
Figure 10B:
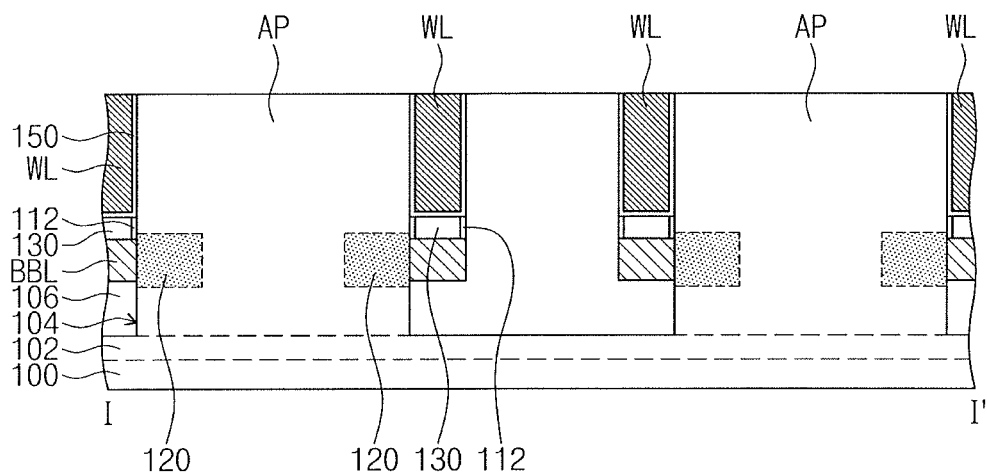
Figure 10C:
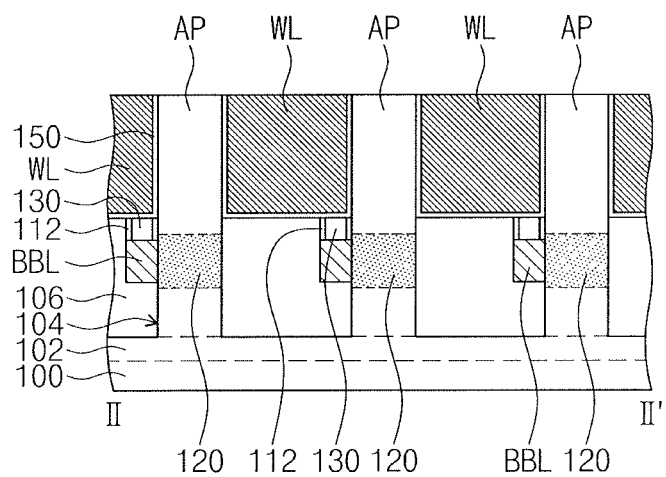

Referring to FIGS. 10A, 10B, and 10C, the gate dielectric pattern 150 and the word line WL may be formed in each of the third trenches 140. For example, the gate dielectric patterns 150 and the word lines WL may be formed by sequentially forming on the substrate 100 a gate dielectric layer and a word line layer to fill the third trenches 140 and performing a planarization process until exposing the top surfaces of the active pillars AP. During the planarization process, the hardmask patterns 108 may be removed. The gate dielectric layer may include, e.g., a silicon oxide layer or a high-k dielectric layer with a dielectric constant greater than that of a silicon oxide layer. The word line layer may include at least one of, e.g., doped semiconductor (e.g., doped silicon), metal (e.g., tungsten, titanium, or tantalum), conductive metal nitride (e.g., titanium nitride or tantalum nitride), or conductive metal-semiconductor compound (e.g., metal silicide).

Figure 11A:
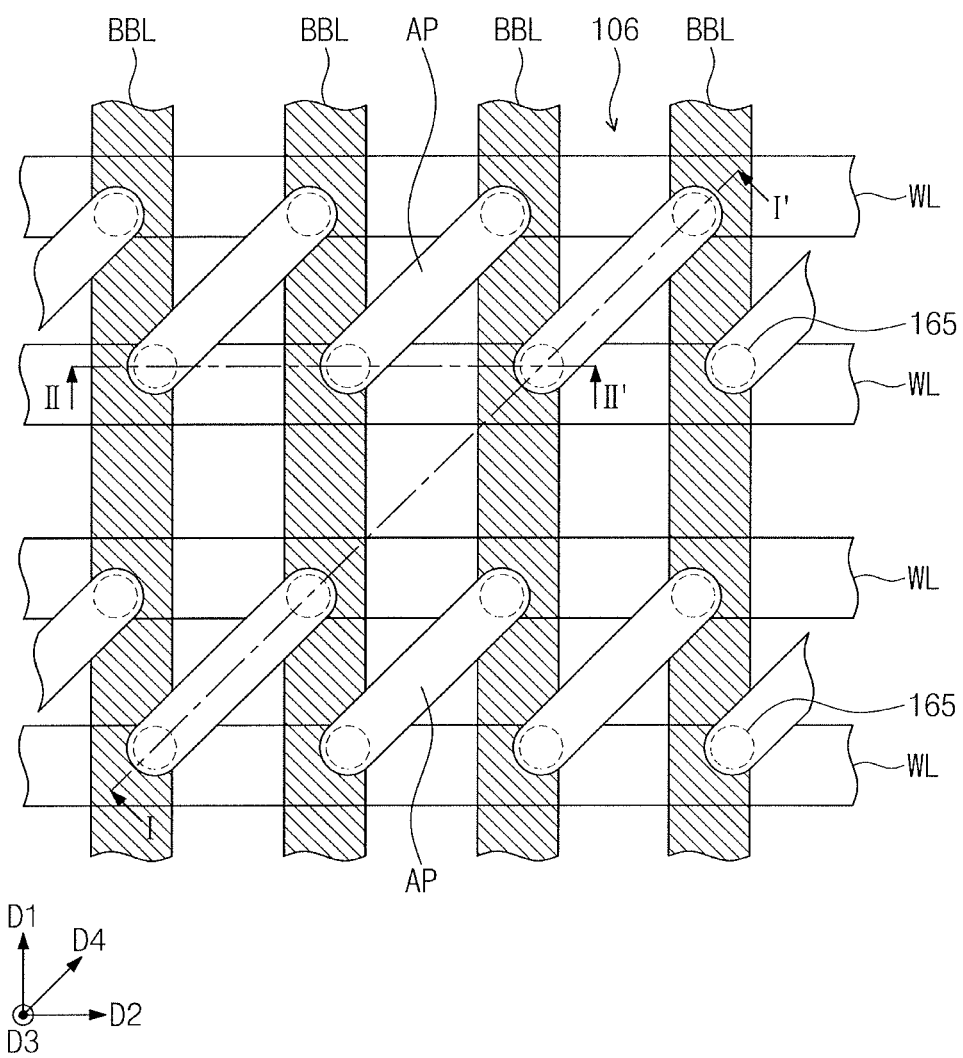
Figure 11B:
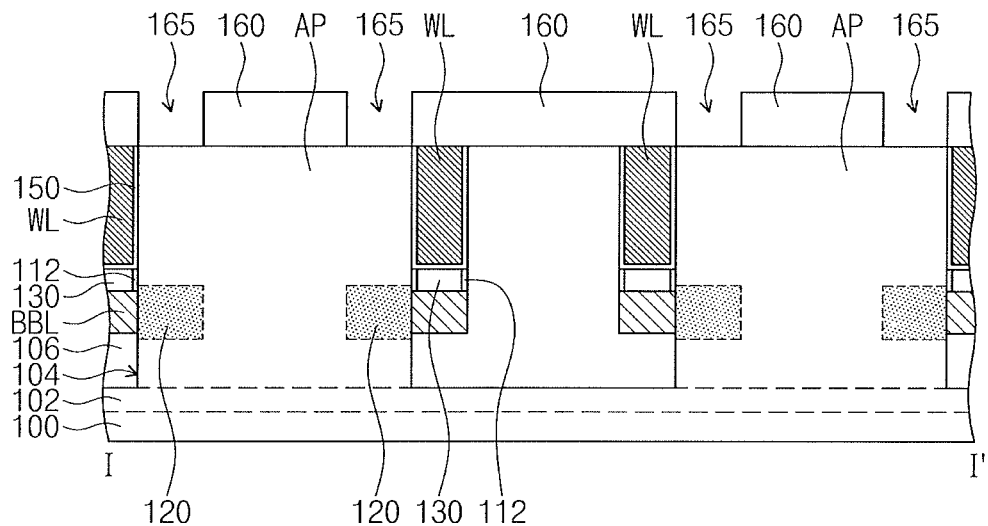
Figure 11C:
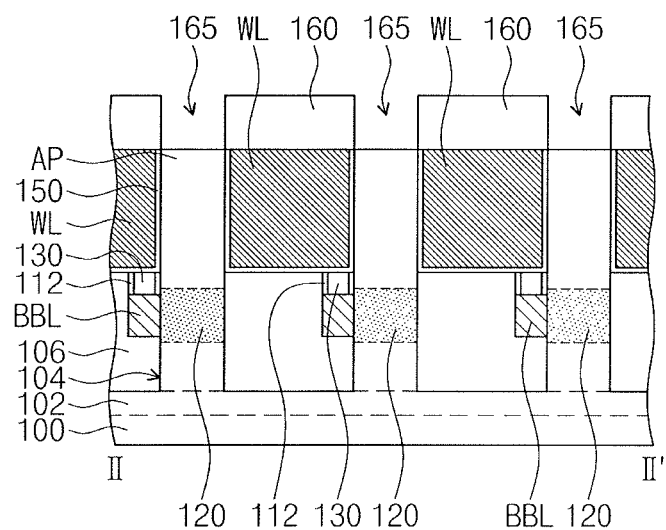

Referring to FIGS. 11A, 11B, and 11C the mold dielectric layer 160 may be formed on an entire surface of the substrate 100. The mold dielectric layer 160 may include at least one of, e.g., a silicon oxide layer or a silicon nitride layer. Thereafter, the mold dielectric layer 160 may be provided therein with mold openings 165 that are formed to, e.g., partially, expose the top surfaces of the active pillars AP. As viewed in a plan view (FIG. 11A), the mold openings 165 may overlap the opposite distal ends of the active pillars AP. For example, a pair of mold openings 165 may be positioned on the distal ends of one active pillar AP.

Figure 12A:
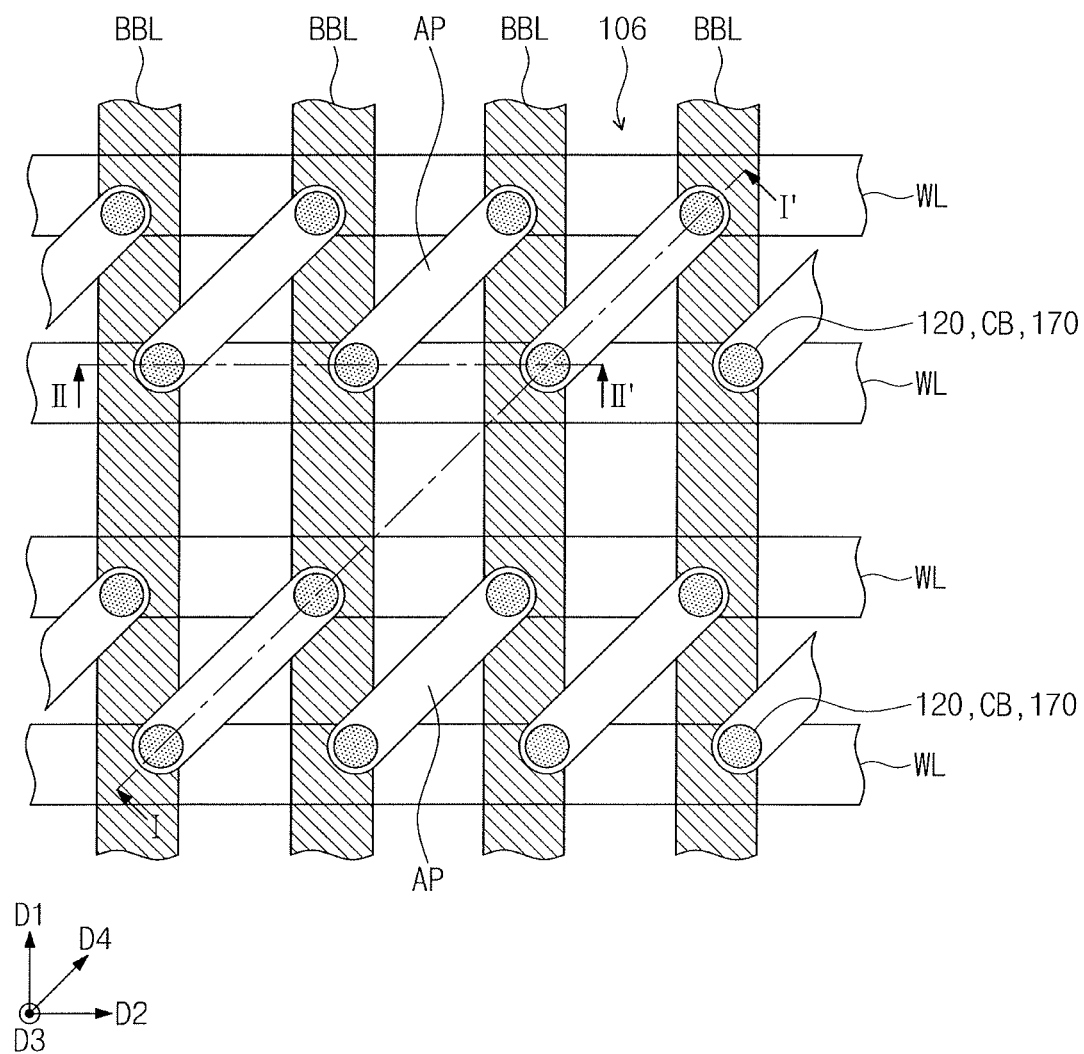
Figure 12B:
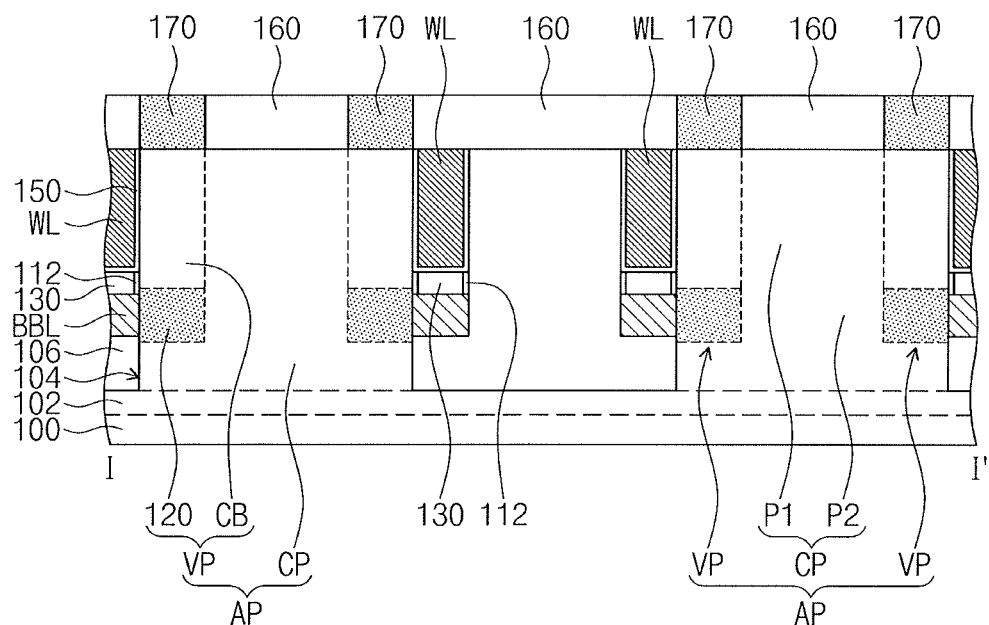
Figure 12C:
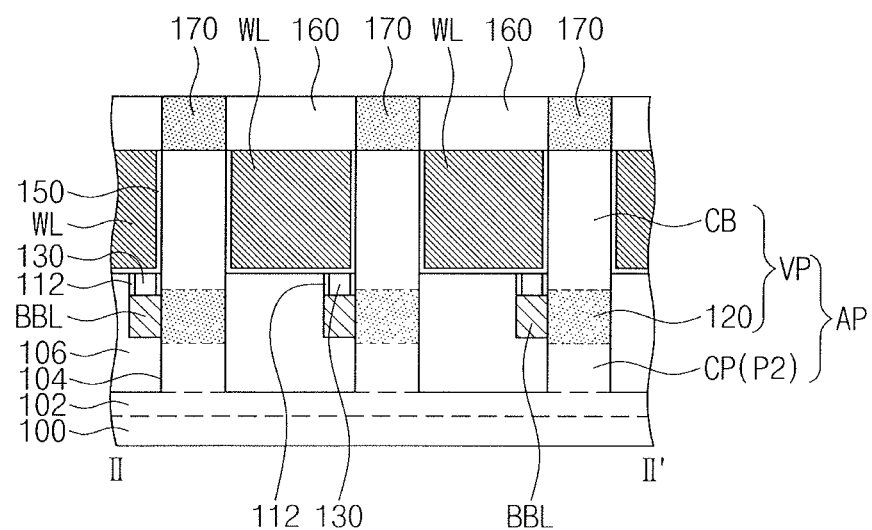

Referring to FIGS. 12A, 12B, and 12C, the upper impurity regions 170 may be formed in the mold openings 165. For example, the upper impurity regions 170 may be formed by forming an epitaxial layer to fill the mold openings 165 and performing a planarization process until exposing the top surface of the mold dielectric layer 160. The epitaxial layer may be formed using a selective epitaxial growth process that uses the top surfaces of the active pillars AP exposed through the mold openings 165 as a seed. Simultaneously with or after the epitaxial growth process, the upper impurity regions 170 may be doped with second conductive impurities (e.g., n-type impurities). The upper impurity regions 170 may include, e.g., a silicon layer.

As the upper impurity regions 170 are formed, each of the active pillars AP may be defined to include a pair of channel bodies CB and a body interconnection CP. The channel bodies CB may be vertically positioned between the lower and upper impurity regions 120 and 170, e.g., each of the channel bodies CB may be defined between corresponding lower and upper impurity regions 120 and 170, and horizontally overlapped with the word lines WL. The body interconnection CP may include the first part P1 in contact with the channel bodies CB, e.g., the first part P1 may have a quadrangular shape extending between and contacting the channel bodies CB, and the second part P2 below the first part P1. The second part P2 of the body interconnection CP may be in contact with the lower impurity regions 120 and the well region 102 of the substrate 100, e.g., the second part P2 may extend between and in contact with facing sidewalls of the lower impurity regions 120 and with the well region 102 to define an inverted T-shape. In an embodiment, the second part P2 of the body interconnection CP may extend between the substrate 100 and the lower impurity regions 120. For example, as illustrated in FIG. 12B, the first and second parts P1 and P2 may be integral with each other, e.g., united into a single and seamless element, and only defined as two parts for convenience of shape description.

Referring back to FIGS. 3A, 3B, and 3C, the contact plugs 180 may be formed in contact with the upper impurity regions 170, and the data storage elements 190 may be formed on the contact plugs 180. Each of the data storage elements 190 may include the bottom electrode 192, the dielectric layer 194, and the top electrode 196. Through the aforementioned processes, it may be possible to fabricate vertical channel transistors illustrated in FIGS. 3A to 3C and a semiconductor device including the vertical channel transistors.

Figure 13:
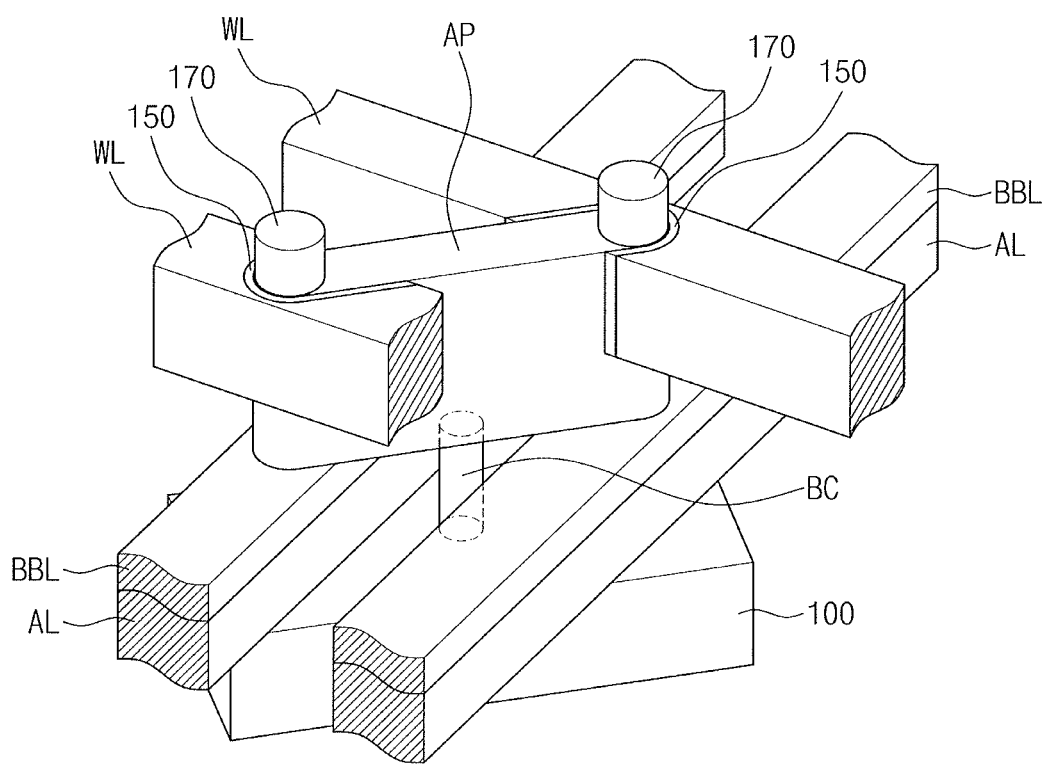
FIG. 13 illustrates a perspective view of vertical channel transistors according to exemplary embodiments.
Figure 14A:
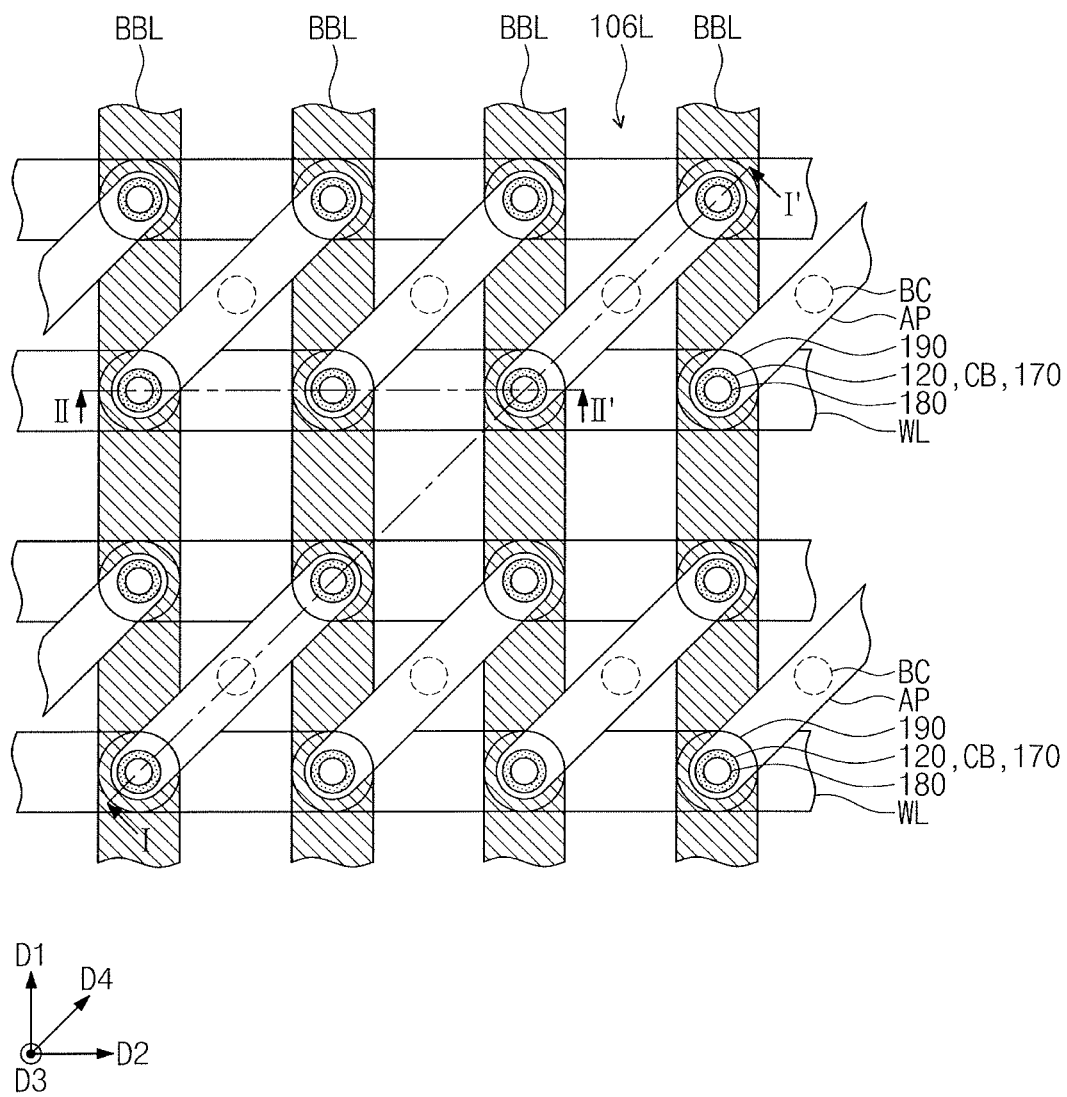
FIG. 14A illustrates a plan view of a semiconductor device including the vertical channel transistors of FIG. 13.
Figure 14B:
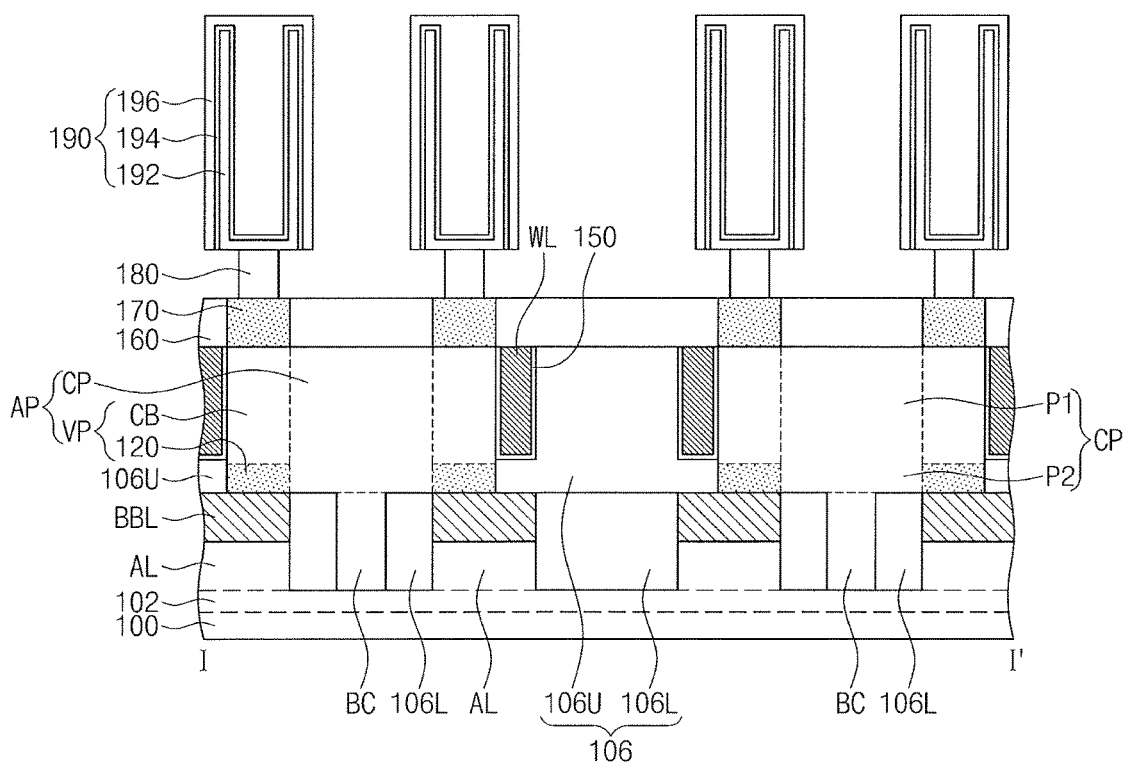
FIGS. 14B and 14C illustrate cross-sectional views respectively taken along lines I-I' and II-II' of FIG. 14A.
Figure 14C:
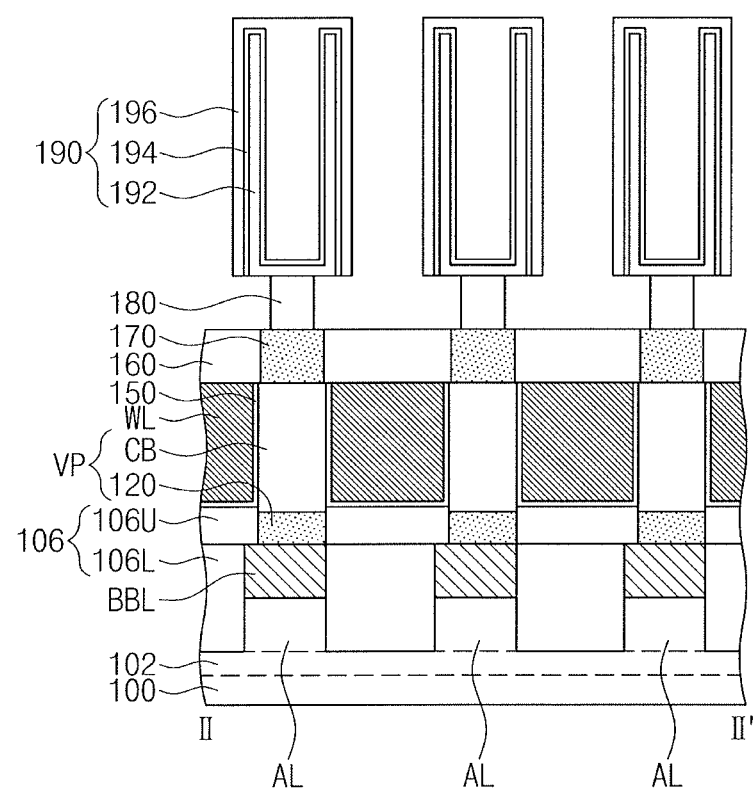

FIG. 13 is a simplified perspective view illustrating vertical channel transistors according to exemplary embodiments. FIG. 14A is a plan view of a semiconductor device including the vertical channel transistors of FIG. 13. FIGS. 14B and 14C are cross-sectional views respectively taken along lines I-I' and II-II' of FIG. 14A. In the embodiment that follows, a pair of channel bodies CB may be commonly connected to the body interconnection CP, which is indirectly connected to the substrate 100 through an interconnect contact BC. For brevity of the description, configurations different from those shown in FIGS. 2 and 3A to 3C will be principally explained.

Referring to FIGS. 13 and 14A to 14C, active lines AL may be disposed between the substrate 100 and the active pillars AP. The active lines AL may have line shapes extending along the first direction D1 and may be arranged spaced apart from each other along the second direction D2. The active lines AL overlap the opposite distal ends of the active pillars AP. The active lines AL may include silicon like the substrate 100. A lower isolation layer 106L may be disposed between the active lines AL. The active lines AL may thus be separated from each other by the lower isolation layer 106L.

The buried bit lines BBL may be disposed between the active lines AL and the opposite distal ends of the active pillars AP. The buried bit lines BBL may side by side extend in the first direction D1 along the active lines AL and have sidewalls aligned with sidewalls of the active lines AL. The buried bit lines BBL may overlap the opposite distal ends of the active pillars AP. The buried bit lines BBL may include, e.g., silicon doped with the second conductive impurities.

The lower impurity regions 120 may be disposed at the opposite distal ends of the active pillars AP overlapping the buried bit lines BBL. The buried bit line BBL and the lower impurity region 120 may respectively have top surfaces and bottom surfaces that are facingly contacted with each other. The buried bit lines BBL may be arranged spaced apart from each other along the second direction D2, and a single buried bit line BBL may be coupled to a plurality of active pillars AP arranged along the first direction D1. For example, a plurality of lower impurity regions 120 commonly coupled to a single buried bit line BBL may be linearly arranged along the first direction D1.

The active pillars AP may be spaced apart from the substrate 100. For example, the second part P2 of the body interconnection CP may have a bottom surface spaced apart from the substrate 100. In an embodiment, the lower isolation layer 106L and the active lines AL each including the buried bit line BBL on its top surface may be interposed between the substrate 100 and the active pillars AP. Interconnect contacts BC may be disposed in the lower isolation layers 106L below the active pillars AP. The interconnect contacts BC may penetrate the lower isolation layer 106L and connect the body interconnection CP to the well region 102 of the substrate 100. In other words, the active pillars AP may be electrically connected to the well region 102 of the substrate 100 through the interconnect contacts BC. Accordingly, an external voltage (see Vbb of FIG. 1) may be supplied to the well region 102 of the substrate 100 and also to the channel bodies CB through the interconnect contacts BC and the body interconnection CP, thereby removing the floating body phenomenon. The interconnect contacts BC may include silicon as like the substrate 100 and may be doped with the first conductive impurities (e.g., p-type impurities).

An upper isolation layer 106U may be disposed between the active pillars AP. The upper isolation layer 106U may cover a top surface of the lower isolation layer 106L and the top surfaces of the buried bit lines BBL. The lower and upper isolation layers 106L and 106U may include, for example, a silicon oxide layer and may be defined to refer to the device isolation layer 106.

The word lines WL may be disposed in the upper isolation layer 106U. The word lines WL may be coupled to the channel bodies CB across the gate dielectric pattern 150. Each of the word lines WL may envelop the sidewall of the channel body CB and extend in the second direction D2. As viewed in plan, the word lines WL may not overlap the active pillar AP. The bottom surfaces of the word lines WL may be higher than the top surfaces of the buried bit lines BBL, and the top surfaces of the word lines WL may have substantially the same heights as that of the top surface of the active pillar AP. The word lines WL may be arranged spaced apart from each other along the first direction D1, and a single word line WL may be coupled to a plurality of active pillars AP arranged along the second direction D2. For example, a plurality of channel bodies CB coupled to a single word line WL may be linearly arranged along the second direction D2.

The gate dielectric pattern 150 may extend between the bottom surface of each of the word lines WL and the upper isolation layer 106U and between a sidewall of each of the word line WL and the upper isolation layer 106U.

Other components are substantially the same as those discussed with reference to FIGS. 2 and 3A to 3C, and detailed descriptions thereof are omitted.

A method of fabricating a semiconductor device including the vertical channel transistors of FIG. 13 will be described hereinafter with reference to FIGS. 15A-20C. FIGS. 15A to 20A are plan views of stages in a method of fabricating a semiconductor device including the vertical channel transistors of FIG. 13. FIGS. 15B to 20B are cross-sectional views taken along line I-I' of FIGS. 15A to 20A, respectively. FIGS. 15C to 20C are cross-sectional views taken along line II-II' of FIGS. 15A to 20A, respectively. For brevity of the description, a repetitive description will be omitted.

Figure 15B:
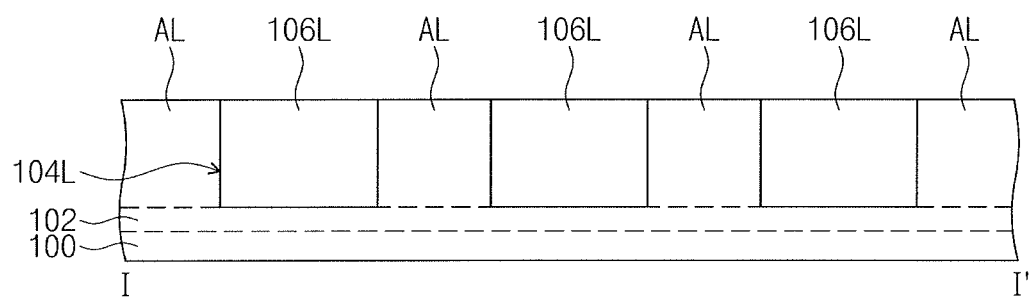
Figure 15C:
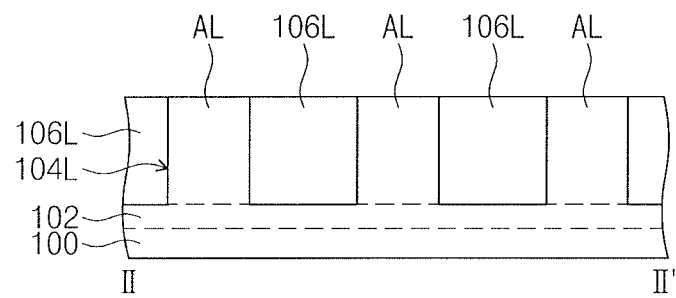

Referring to FIGS. 15A, 15, and 15C, the lower isolation layer 106L may be formed to define active lines AL in the substrate 100. The lower isolation layer 106L may have a plurality of line shapes side by side extending in the first direction D1. The lower isolation layer 106L may be formed by forming a lower trench 104L in the substrate 100 and filling the lower trench 104L with a dielectric layer. The lower isolation layer 106L may include, for example, a silicon oxide layer. As a result, the active lines AL may have line shapes extending in the first direction D1 and protrude from the substrate 100 in the third direction D3.

Figure 16A:
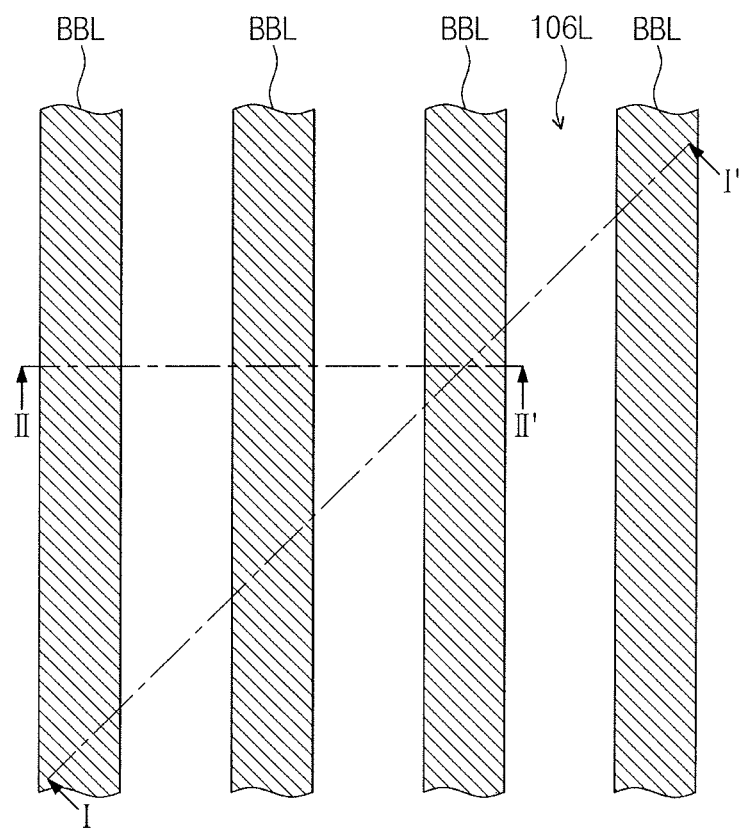
Figure 16B:
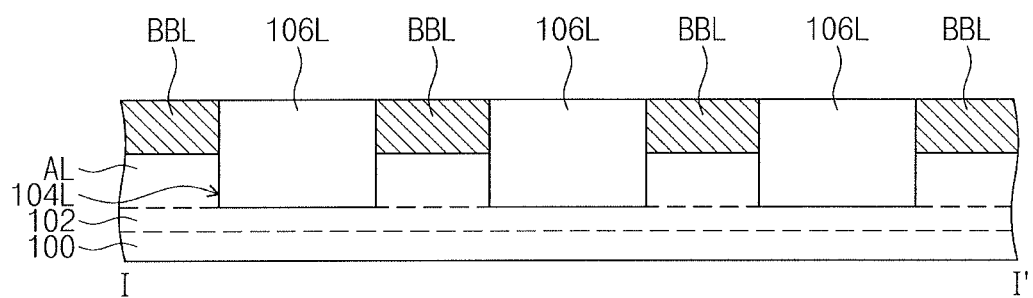
Figure 16C:
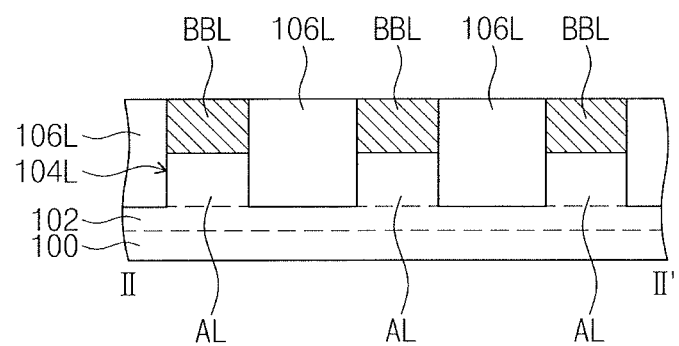

Referring to FIGS. 16A, 16B, and 16C, an impurity may be injected into upper portions of the active lines AL to form the buried bit lines BBL. For example, the buried bit lines BBL may be formed using an ion implantation process and a diffusion process and may be doped with the second conductive impurities (e.g., n-type impurities). The buried bit lines BBL may extend in the first direction D1 along the active lines AL.

Figure 17A:
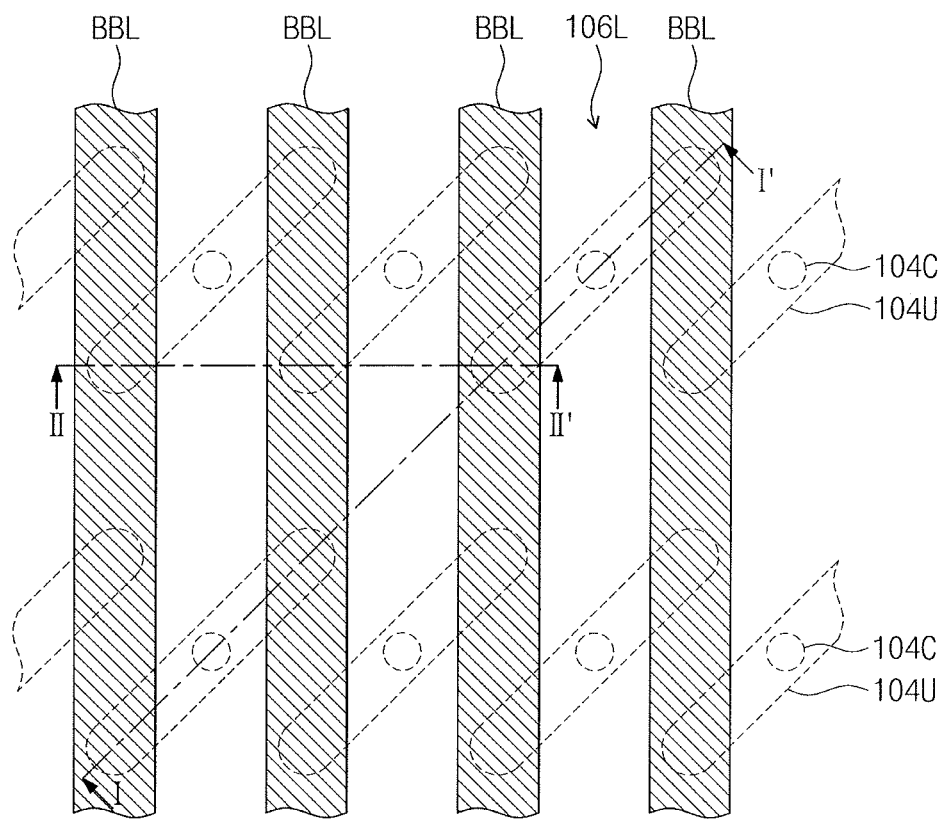
Figure 17B:
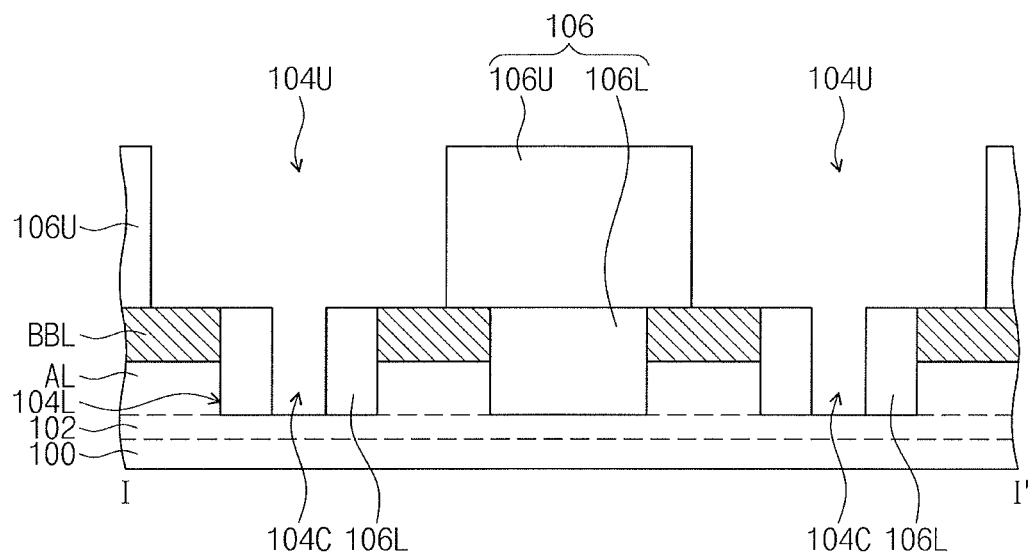
Figure 17C:
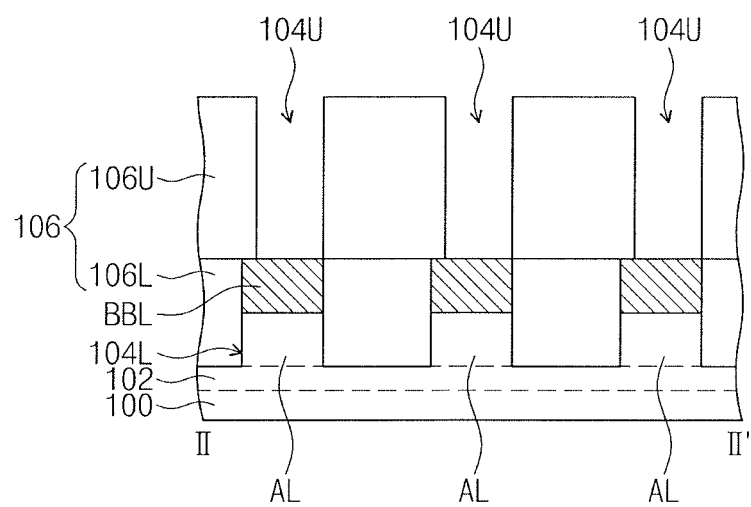

Referring to FIGS. 17A, 17B, and 17C, an upper isolation layer 106U may be formed on an entire surface of the substrate 100. The upper isolation layer 106U may include, for example, a silicon oxide layer. The lower and upper isolation layers 106L and 106U may be defined to refer to the device isolation layer 106.

Thereafter, upper trenches 104U may be formed in the upper isolation layer 106U, and interconnect contact holes 104C may be formed in the lower isolation layer 106L. As viewed in plan, each of the upper trenches 104U may include an island shape elongating the fourth direction D4 diagonal to the first and second directions D1 and D2 and have distal ends overlapping the buried bit lines BBL. The upper trenches 104U may penetrate the upper isolation layer 106U to expose top surfaces of the lower isolation layer 106L and the buried bit lines BBL. The interconnect contact holes 104C may penetrate the lower isolation layer 106L that is exposed through the upper trenches 104U, thereby exposing the well region 102 of the substrate 100. Each of the interconnect contact holes 104C may be spatially connected to its overlying upper trench 104U.

Figure 18A:
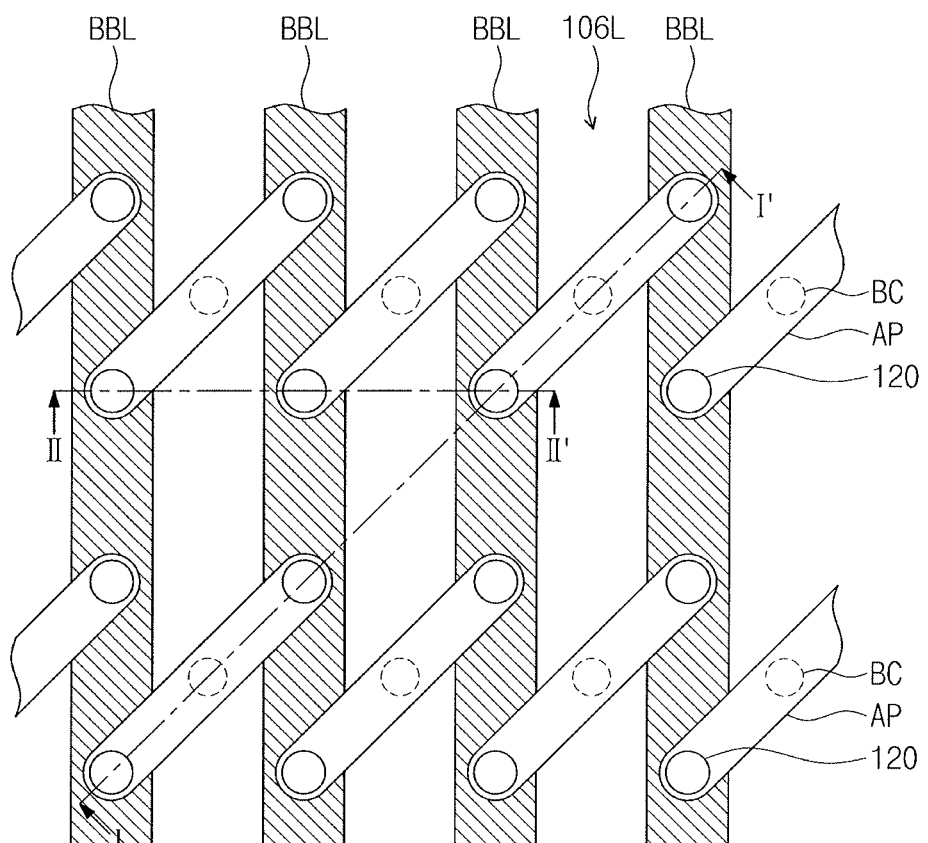
Figure 18B:
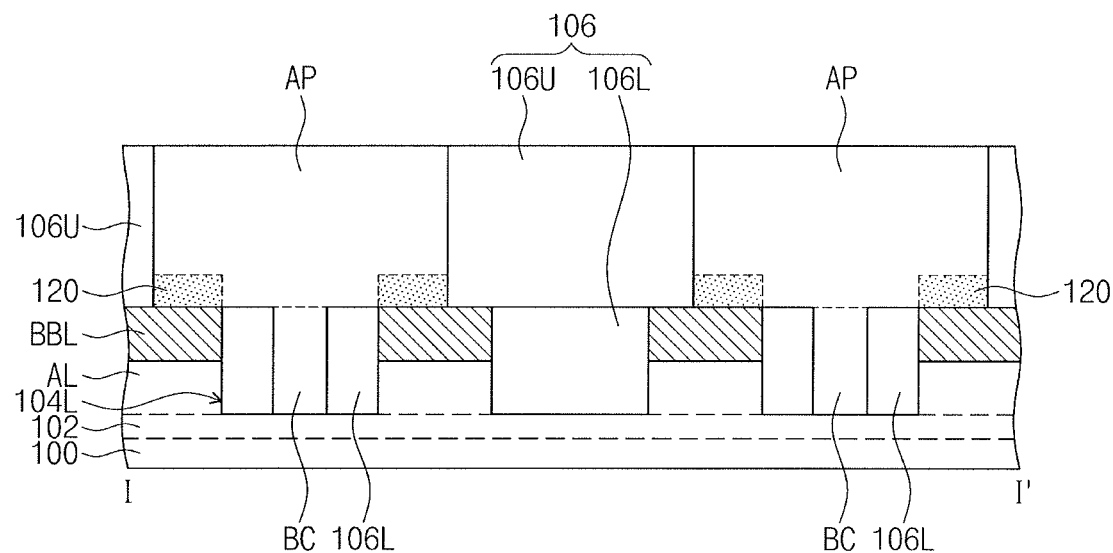
Figure 18C:
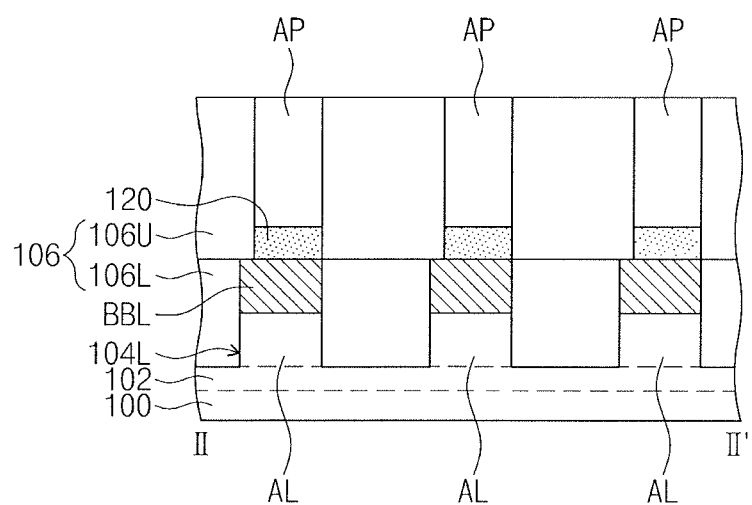

Referring to FIGS. 18A, 18B, and 18C, interconnect contacts BC may be formed in the interconnect contact holes 104C, and the active pillars AP may be formed in the upper trenches 104U. For example, the interconnect contacts BC and the active pillars AP may be formed by forming an epitaxial layer to fill the interconnect contacts BC and the active pillars AP and performing a planarization process until exposing the top surface of the upper isolation layer 106U. The epitaxial layer may be formed by a selective epitaxial growth process that uses a top surface of the substrate 100 exposed through the interconnect contact holes 104C as a seed. Simultaneously with or after the epitaxial growth process, the interconnect contacts BC and the active pillars AP may be doped with first conductive impurities (e.g., p-type impurities). The interconnect contacts BC and the active pillars AP may include, for example, a silicon layer.

The lower impurity regions 120 may be formed in the active pillars AP such that the buried bit lines BBL may be in contact with the lower impurity regions 120. For example, after the active pillars AP are formed, a heat treatment process may be performed to allow impurities doped in the buried bit lines BBL to diffuse into the active pillars AP, and therefore the lower impurity regions 120 are formed. The lower impurity regions 120 may then have second conductivity.

Figure 19A:
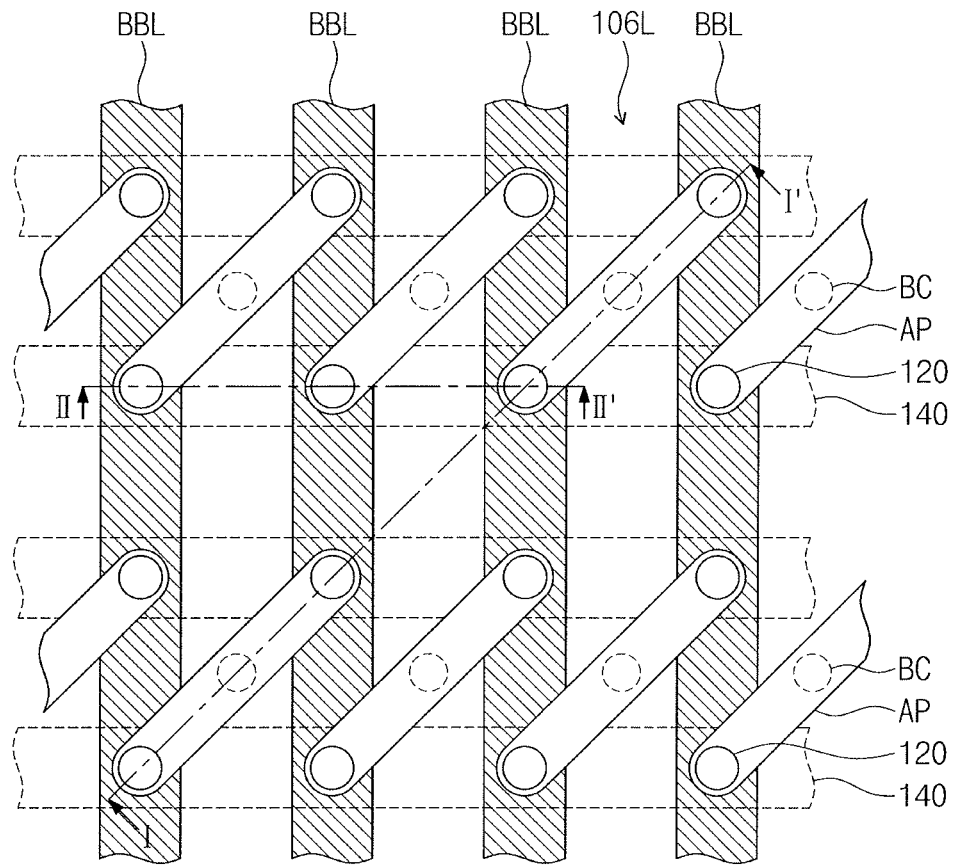
Figure 19B:
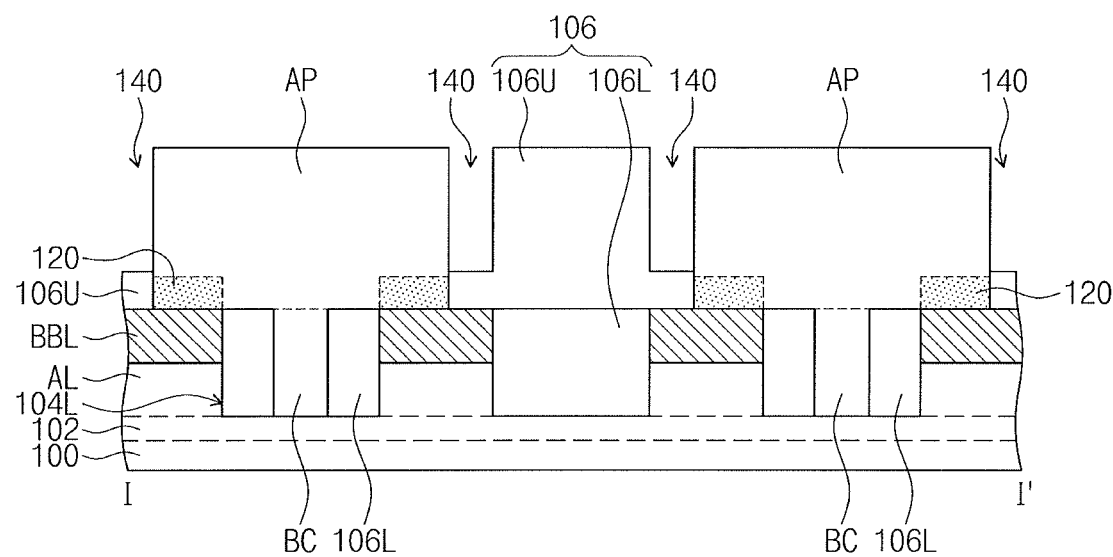
Figure 19C:
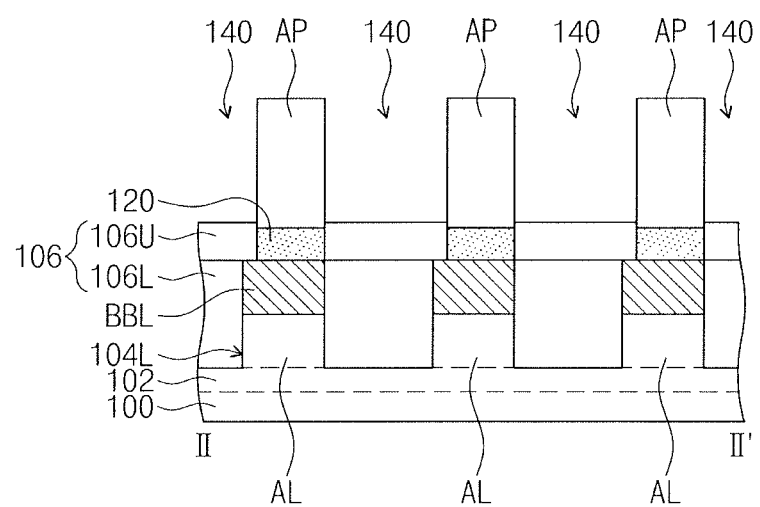

Referring to FIGS. 19A, 19B, and 19C, the upper isolation layer 106U may be partially removed to form the third trenches 140. The third trenches 140 may be formed to have line shapes side by side extending in the second direction D2 and expose the sidewalls of the distal ends of the active pillars AP. The third trenches 140 may be formed to have depths less than that of the upper isolation layer 106U. The third trenches 140 may have bottom surfaces spaced apart from top surfaces of the buried bit lines BBL. For example, the third trenches 140 may be formed by forming a mask pattern (not shown) on the substrate 100 and performing an etching process using the mask pattern (not shown) as an etching mask to etch the upper isolation layer 106U exposed through the mask pattern (not shown). The mask pattern (not shown) may not expose top surfaces of the active pillars AP. When the third trenches 140 are formed, the distal ends of the active pillars AP may not be removed.

Figure 20A:
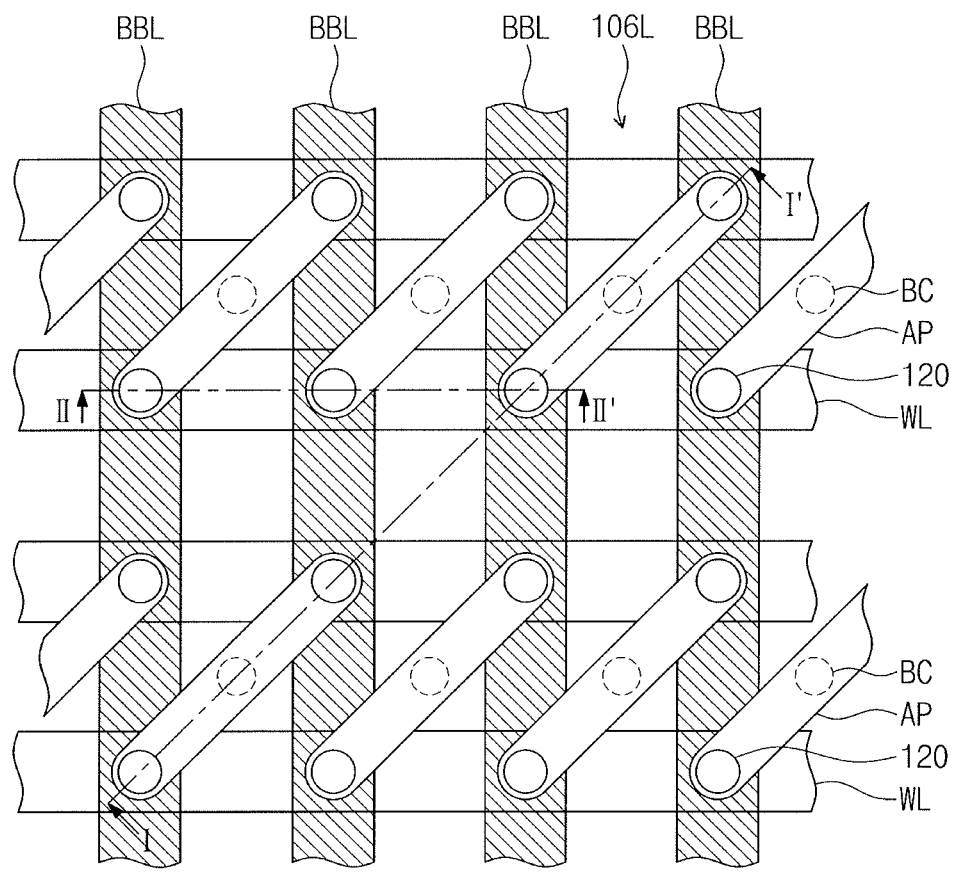
Figure 20B:
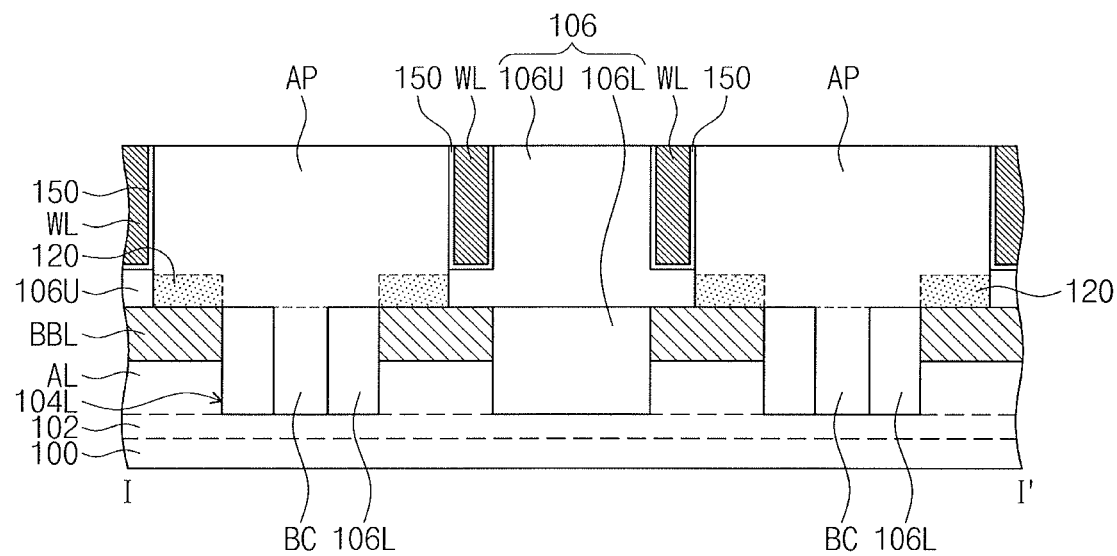
Figure 20C:
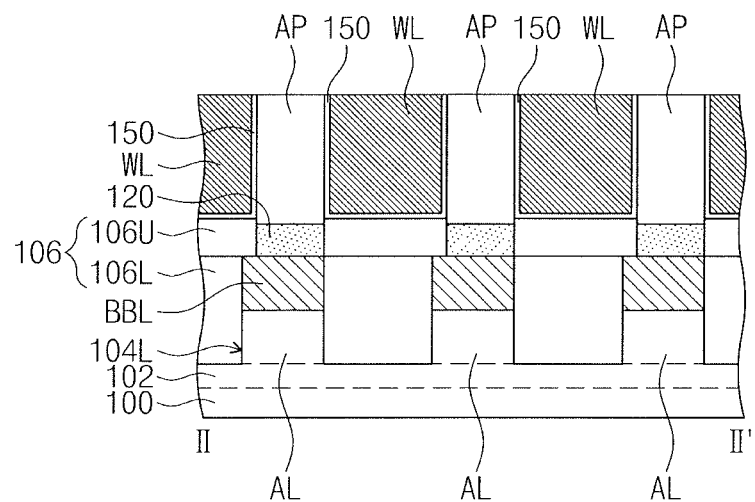

Referring to FIGS. 20A, 20B, and 20C, the gate dielectric pattern 150 and the word line WL may be formed in each of the third trenches 140. For example, the gate dielectric patterns 150 and the word lines WL may be formed by sequentially forming on the substrate 100 a gate dielectric layer and a word line layer to fill the third trenches 140 and performing a planarization process until exposing the top surfaces of the active pillars AP.

Referring back to FIGS. 14A, 14B, and 14C, the mold dielectric layer 160 may be formed on an entire surface of the substrate 100, and the upper impurity regions 170 may be formed in the mold dielectric layer 160. The upper impurity regions 170 may be positioned on the opposite distal ends of the active pillars AP and in contact with the top surfaces of the active pillars AP therebelow. The mold dielectric layer 160 and the upper impurity regions 170 may be formed using the same materials and methods as those discussed with reference to FIGS. 12A to 12C.

Thereafter, the contact plugs 180 may be formed in contact with the upper impurity regions 170, and the data storage elements 190 may be formed on the contact plugs 180. Each of the data storage elements 190 may include the bottom electrode 192, the dielectric layer 194, and the top electrode 196. Through the aforementioned processes, it may be possible to fabricate vertical channel transistors illustrated in FIGS. 13, and 14A to 14C and a semiconductor device including the vertical channel transistors.

By way of summation and review, high integration of semiconductor devices may include forming transistors having vertical channels. When the vertical channel transistor is applied to a DRAM device, a source and a drain of the transistor can be vertically stacked, thereby reducing the space required for the transistor. However, this configuration of the vertical channel transistor may cause floating, i.e., a substrate is not connected to a channel region (or a channel body) between the source and the drain.

In contrast, according to the present disclosure, a single active pillar may be embodied as two unit memory cells. To put it another way, a single active pillar may be shared by a pair of unit memory cells that are diagonally adjacent to each other. A single active pillar may include the vertical sections constituting a pair of vertical channel transistors and the body interconnection between the vertical sections. The body interconnection may be commonly connected to the channel bodies of the vertical sections and also be connected to the well region of the substrate. In this configuration, an external voltage is applied to the well region of the substrate and also to the channel bodies through the body interconnection, so that the channel bodies may be prevented from floating. Therefore, the semiconductor device including the vertical channel transistors according to exemplary embodiments may be free of floating body effect, thereby being prevented from increased threshold instability of transistors and from deteriorated dynamic reference characteristics of semiconductor memory devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an active pillar that protrudes above a substrate, the active pillar including a pair of vertical sections and a body interconnection between the pair of vertical sections, and each of the pair of vertical sections having a channel body and a lower impurity region below the channel body;
   word lines coupled to respective channel bodies; and
   buried bit lines in contact with respective lower impurity regions,
   wherein the channel bodies are connected to the substrate through the body interconnection.

2. The semiconductor device as claimed in claim 1, wherein the body interconnection includes:
   a first part that is commonly connected to the channel bodies; and
   a second part that extends downwardly from the first part and is in contact with the lower impurity regions, the second part having a bottom surface in contact with the substrate.

3. The semiconductor device as claimed in claim 2, wherein the second part extends between the substrate and the lower impurity regions.

4. The semiconductor device as claimed in claim 2, wherein:
   each of the pair of vertical sections is at each of opposite distal ends of the active pillar,
   each of the buried bit lines envelops a sidewall of a respective one of the lower impurity regions and extends in a first direction,
   each of the word lines envelops a sidewall of a respective one of the channel bodies and extends in a second direction crossing the first direction, and
   the active pillar has an island shape extending in a direction diagonal with respect to the first and second directions.

5. The semiconductor device as claimed in claim 4, wherein the buried bit lines include a metallic material.

6. The semiconductor device as claimed in claim 1, further comprising:
   a lower isolation layer between the substrate and the active pillar; and
   an interconnect contact in the lower dielectric layer, the body interconnection being connected to the substrate through the interconnect contact.

7. The semiconductor device as claimed in claim 6, further comprising active lines on opposite sides of the lower isolation layer and overlapping opposite distal ends of the active pillar, each of the buried bit lines is between one of the opposite distal ends of the active pillar and one of the active lines.

8. The semiconductor device as claimed in claim 1, wherein the word lines are arranged along a first direction and the buried bit lines are arranged along a second direction crossing the first direction, such that the buried bit lines cross the word lines, and the active pillar diagonally connecting cross-connections between the buried bit lines and the word lines, in plan view.

9. The semiconductor device as claimed in claim 1, further comprising:
   upper impurity regions on top surfaces of corresponding channel bodies; and
   data storage elements electrically connected to corresponding upper impurity regions.

10. The semiconductor device as claimed in claim 1, wherein:
    the channel bodies and the body interconnection are doped with first conductive impurities, and
    the lower impurity regions are doped with second conductive impurities different from the first conductive impurities.

11. A semiconductor device, comprising:
    a first vertical channel transistor and a second vertical channel transistor on a substrate; and
    a body interconnection commonly connected to a first channel body of the first vertical channel transistor and to a second channel body of the second vertical channel transistor,
    wherein the body interconnection is electrically connected to the substrate,
    wherein the first and second vertical channel transistors share one active pillar including the first and second channel bodies and the body interconnection, the active pillar further including first and second lower impurity regions respectively disposed below the first and second channel bodies,
    wherein the first and second channel bodies and the body interconnection are doped with first conductive impurities, and
    wherein the first and second lower impurity regions are doped with second conductive impurities different from the first conductive impurities.

12. The semiconductor device as claimed in claim 11, further comprising:

first and second word lines respectively coupled to the first and second channel bodies; and first and second buried bit lines respectively in contact with the first and second lower impurity regions, wherein the first and second word lines are arranged along a first direction and the first and second buried bit lines are arranged along a second direction crossing the first direction, such that the first and second buried bit lines cross the first and second word lines, and wherein the active pillar is disposed to diagonally connect cross-connections between the first and second word lines and the first and second buried bit lines, in plan view.

13. The semiconductor device as claimed in claim 11, wherein the body interconnection includes:

a first part that is commonly connected to the first and second channel bodies; and a second part that extends downwardly from the first part and is in contact with the first and second lower impurity regions, wherein the second part has a bottom surface in contact with the substrate.

14. The semiconductor device as claimed in claim 11, wherein the body interconnection includes:

a first part that is commonly connected to the first and second channel bodies; and a second part that extends downwardly from the first part and is in contact with the first and second lower impurity regions, the semiconductor device including an interconnect contact that connects the substrate to the second part of the body interconnection.

15. A semiconductor device, comprising:

an active pillar that protrudes above a substrate, the active pillar including:

vertical channel bodies respectively provided at two distal opposite ends of the active pillar, a body interconnection between the two distal opposite ends of the active pillar, the body interconnection electrically connecting the vertical channel bodies to the substrate, and lower impurity regions respectively provided at the two distal opposite ends of the active pillar, each of the lower impurity regions being between each of the vertical channel bodies and the substrate;

word lines covering respective sidewalls of the two distal opposite ends of the active pillar and being adjacent to respective vertical channel bodies; and buried bit lines respectively provided at the two distal opposite ends of the active pillar and being in contact with respective lower impurity regions.

16. The semiconductor device as claimed in claim 15, wherein the body interconnection is integral with the vertical channel bodies and with the substrate, the vertical channel bodies being connected to different word lines and different buries bit lines.

17. The semiconductor device as claimed in claim 16, further comprising:

an upper impurity region on each vertical channel body, each vertical channel body being defined between corresponding upper and lower impurity regions.

18. The semiconductor device as claimed in claim 16, wherein the body interconnection includes a same material as the vertical channel bodies and as the substrate, the body interconnection having an inverted T-shape.

19. The semiconductor device as claimed in claim 15, wherein the vertical channel bodies constitute separate unit memory cells within the active pillar, the unit memory cells being electrically connected to the substrate via the body interconnection.

* * * * *